(12) United States Patent
Yamazaki et al.

(10) Patent No.: US 8,664,653 B2
(45) Date of Patent: Mar. 4, 2014

(54) SEMICONDUCTOR DEVICE AND METHOD FOR MANUFACTURING SEMICONDUCTOR DEVICE

(75) Inventors: Shunpei Yamazaki, Setagaya (JP); Hiromichi Godo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 235 days.

(21) Appl. No.: 13/037,545

(22) Filed: Mar. 1, 2011

(65) Prior Publication Data
US 2011/0215317 A1 Sep. 8, 2011

(30) Foreign Application Priority Data

Mar. 8, 2010 (JP) ................................. 2010-051008

(51) Int. Cl.
*H01L 27/088* (2006.01)
*H01L 29/78* (2006.01)
*H01L 21/34* (2006.01)

(52) U.S. Cl.
USPC ................ 257/43; 257/E29.255; 257/E27.06; 257/E21.46; 257/347; 257/646; 438/104; 438/412; 438/722; 438/151; 438/157

(58) Field of Classification Search
USPC ......... 257/43, E29.255, E27.06, E21.46, 347, 257/57, 72, 646; 438/104, 412, 722, 151, 438/157, 795
See application file for complete search history.

(56) References Cited

U.S. PATENT DOCUMENTS

| 4,902,637 A | 2/1990 | Kondou et al. |
| 5,712,496 A | 1/1998 | Takahashi et al. |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

(Continued)

*Primary Examiner* — Cathy N Lam
(74) *Attorney, Agent, or Firm* — Eric J. Robinson; Robinson Intellectual Property Law Office, P.C.

(57) ABSTRACT

Disclosed is a semiconductor device including an insulating layer, a source electrode and a drain electrode embedded in the insulating layer, an oxide semiconductor layer in contact with the insulating layer, the source electrode, and the drain electrode, a gate insulating layer covering the oxide semiconductor layer, and a gate electrode over the gate insulating layer. The upper surface of the surface of the insulating layer, which is in contact with the oxide semiconductor layer, has a root-mean-square (RMS) roughness of 1 nm or less. There is a difference in height between an upper surface of the insulating layer and each of an upper surface of the source electrode and an upper surface of the drain electrode. The difference in height is preferably 5 nm or more. This structure contributes to the suppression of defects of the semiconductor device and enables their miniaturization.

18 Claims, 18 Drawing Sheets

(56) References Cited

U.S. PATENT DOCUMENTS

| | | |
|---|---|---|
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0160235 A1* | 8/2003 | Hirai ............................. 257/40 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1* | 8/2007 | Furuta et al. .................. 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1* | 6/2010 | Hayashi et al. .................. 257/43 |
| 2011/0089419 A1 | 4/2011 | Yamazaki et al. |
| 2011/0101351 A1 | 5/2011 | Yamazaki |
| 2011/0156028 A1 | 6/2011 | Yamazaki et al. |
| 2011/0157961 A1 | 6/2011 | Yamazaki et al. |
| 2011/0175087 A1 | 7/2011 | Yamazaki et al. |
| 2011/0210957 A1 | 9/2011 | Koyama et al. |
| 2011/0215326 A1 | 9/2011 | Godo et al. |
| 2013/0057315 A1 | 3/2013 | Kato et al. |
| 2013/0127497 A1 | 5/2013 | Koyama et al. |

FOREIGN PATENT DOCUMENTS

| | | |
|---|---|---|
| JP | 60-198861 A | 10/1985 |
| JP | 61-204976 A | 9/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-023101 A | 1/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-021170 A | 1/2010 |
| WO | WO-2004/114391 | 12/2004 |

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 96, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO system,", Journal of Solid State Chemistry, Apr. 1, 1995, vol. 116, No. 1 pp. 170-178.

(56) References Cited

OTHER PUBLICATIONS

Nakamura.M et al., "Syntheses and crystal structures of new homologous compounds, indium iron zinc oxides (InFeO3(ZnO)m) (m natural number) and related compounds,", KOTAI BUTSURI (Solid State Physics), 1993, vol. 28, No. 5, pp. 317-327.
Nomura.K et al., "Thin-Film Transistor Fabricated in Single-Crystalline Transpartent Oxide Semiconductor,", Science, May 23, 2003, vol. 300, No. 5623, pp. 1269-1272.
Kawamura.T et al., "Low-Voltage Operating Amorphous Oxide TFTs,", IDW '09 : Proceedings of the 16th International Display Workshops, Dec. 9, 2009, pp. 1689-1692.
Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.
Kim.W et al., "An Experimental High-Density DRAM Cell with a Built-in Gain Stage,", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.
International Search Report (Application No. PCT/JP2011/053589) Dated May 24, 2011.
Written Opinion (Application No. PCT/JP2011/053589) Dated May 24, 2011.
Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.
Lee.M at al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakatai et al., "Development of 4.0-In. AMOLED Display With Driver Circuit Using Amorphous IN—GA—ZN—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZNO TFT,", IMID '07 Digest, 2007, pp. 1249-1252.
Godo.H et al., "Temperature Dependence of Characteristics and Electronic Structure for Amorphous IN—GA—ZN—Oxide TFT,", AM-FPD '09 Digest of Technical Papers, Jul. 1, 2009, pp. 41-44.
Osada.T et al., "Development of Driver-Integrated Panel Using Amorphous IN—GA—ZN—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZNO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous IN—GA—ZN—Oxide TFT,", SID Digest '09 : SID International Symposium Digest of Technical Papers, May 31, 2009, pp. 1110-1112.
Ohara.H et al., "21.3:4.0 In. QVGA AMOLED Display Using IN—GA—ZN—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 1, 2002, vol. 1, pp. 64-68.
Kimizuka.N. et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M at al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4; 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317.
Clark.S at al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vas. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner vertical axis: S value [V/dec]
Vds=1V

SEMICONDUCTOR DEVICE AND METHOD FOR MANUFACTURING SEMICONDUCTOR DEVICE

TECHNICAL FIELD

The present invention relates to a semiconductor device and a manufacturing method thereof. Note that semiconductor devices herein refer to general elements and devices which function by utilizing semiconductor characteristics.

BACKGROUND ART

There are a wide variety of metal oxides and such metal oxides are used for various applications. Indium oxide is a well-known material and is used as a material for transparent electrodes which are needed for liquid crystal display devices or the like.

Some metal oxides have semiconductor characteristics. Examples of such metal oxides having semiconductor characteristics include tungsten oxide, tin oxide, indium oxide, zinc oxide, and the like. A thin film transistor in which a channel formation region is formed using such a metal oxide has been already known (see, for example, Patent Documents 1 to 4, Non-Patent Document 1, and the like).

Examples of metal oxides include not only a single-component oxide but also a multi-component oxide. For example, $InGaO_3(ZnO)_m$ (m: natural number) having a homologous phase is known as a multi-component oxide semiconductor including In, Ga, and Zn (see, for example, Non-Patent Documents 2 to 4 and the like).

Furthermore, it has been confirmed that an oxide semiconductor including such an In—Ga—Zn-based oxide can also be applied to a channel formation region of a thin film transistor (see, for example, Patent Document 5, Non-Patent Documents 5 and 6, and the like).

In order to achieve high speed operation of a transistor or the like, miniaturization of the transistor is needed. For example, in Patent Document 6, a thin film transistor including an oxide semiconductor used for a channel layer with a thickness of about 10 nm or smaller is disclosed. In Non-Patent Document 7, a thin film transistor including an oxide semiconductor whose channel length is 2 μm to 100 μm is disclosed.

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2010-21170

Non-Patent Documents

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492
[Non-Patent Document 7] T. Kawamura, H. Uchiyama, S. Saito, H. Wakana, T. Mine, and M. Hatano, "Low-Voltage Operating Amorphous Oxide TFTs", IDW'09, pp. 1689-1692

DISCLOSURE OF INVENTION

In the case where a transistor is miniaturized, a defect generated in the manufacturing process becomes a major problem. For example, in a transistor where a semiconductor layer is formed over a wiring functioning as a source or drain electrode, a gate electrode or the like, the wiring has a larger thickness than the semiconductor layer, which causes poor coverage with the semiconductor layer when the thickness of the semiconductor layer is reduced along with miniaturization. As a result, disconnection, defective connection, or the like may occur.

In the case where a transistor is miniaturized, another problem of a short channel effect arises. The short-channel effect refers to degradation of electrical characteristics which becomes obvious with miniaturization of a transistor (a reduction in channel length (L)). The short-channel effect results from the effect of an electric field of a drain on a source. Specific examples of the short-channel effect are a decrease in threshold voltage, an increase in S value (subthreshold swing), an increase in leakage current, and the like. The short-channel effect is likely to occur in a transistor including an oxide semiconductor particularly because such a transistor cannot control threshold voltage by doping, unlike a transistor including silicon.

In view of this, it is an object of one embodiment of the disclosed invention to provide a semiconductor device which suppresses a defect and achieves miniaturization. Further, it is another object of one embodiment of the disclosed invention to provide a semiconductor device which maintains favorable characteristics and achieves miniaturization.

An embodiment of the disclosed invention is a semiconductor device including an insulating layer, a source electrode and a drain electrode embedded in the insulating layer, an oxide semiconductor layer in contact with a part of a surface of the insulating layer, a part of a surface of the source electrode, and a part of a surface of the drain electrode, a gate insulating layer covering the oxide semiconductor layer, and a gate electrode over the gate insulating layer. The part of the surface of the insulating layer, which is in contact with the oxide semiconductor layer, has a root-mean-square (RMS) roughness of 1 nm or less. The difference in height between the part of the surface of the insulating layer and the surface of the source electrode and the difference in height between the part of the surface of the insulating layer and the surface of the drain electrode are 5 nm or more. Note that in the above semiconductor device, the difference in height between the part of the surface of the insulating layer and the surface of the source electrode and the difference in height between the part of the surface of the insulating layer and the surface of the drain electrode may be 20 nm or less.

Note that in this specification, the root-mean-square (RMS) roughness is obtained by three-dimensionally expanding the RMS roughness of a cross section curve so as to be able to apply it to the measurement surface. The RMS roughness is represented by the square root of the mean value of the square of the deviation from the reference surface to the specific surface, and is obtained by the following formula.

$$R_{ms} = \sqrt{\frac{1}{S_0}\int_{Y_1}^{Y_2}\int_{X_1}^{X_2}\{F(X, Y) - Z_0\}^2 dX dY} \quad \text{[Formula 1]}$$

Note that the measurement surface is a surface which is shown by all the measurement data, and is represented by the following formula.

$$Z = F(X, Y) \quad \text{[Formula 2]}$$

The specific surface is a surface which is an object of roughness measurement, and is a rectangular region which is surrounded by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$. Note that $S_0$ can be obtained by the following formula.

$$S_0 = |X_2 - X_1| \cdot |Y_2 - Y_1| \quad \text{[Formula 3]}$$

In addition, the reference surface refers to a surface parallel to an X-Y surface at the average height of the specific surface. In short, when the average value of the height of the specific surface is denoted by $Z_0$, the height of the reference surface is also denoted by $Z_0$. Note that $Z_0$ can be obtained by the following formula.

$$Z_0 = \frac{1}{S_0}\int_{Y_1}^{Y_2}\int_{X_1}^{Y_2} F(X, Y) dX dY \quad \text{[Formula 4]}$$

Note that in this specification, the root-mean-square (RMS) roughness is calculated in a region of 10 nm×10 nm, preferably 100 nm×100 nm, more preferably 1 μm×1 μm from an AFM image obtained using an atomic force microscope (AFM).

Another embodiment of the disclosed invention is a semiconductor device including a first transistor, and a second transistor over the first transistor. The first transistor includes a first channel formation region, a first gate insulating layer provided over the first channel formation region, a first gate electrode provided over the first gate insulating layer so as to overlap with the first channel formation region, and a first source electrode and a first drain electrode electrically connected to the first channel formation region. The second transistor includes a second source electrode and a second drain electrode embedded in an insulating layer, a second channel formation region in contact with a part of a surface of the insulating layer, a part of a surface of the second source electrode, and a part of a surface of the second drain electrode, a second gate insulating layer covering the second channel formation region, and a second gate electrode over the second gate insulating layer. The part of the surface of the insulating layer, which is in contact with the second channel formation region, has a root-mean-square roughness of 1 nm or less. The difference in height between the part of the surface of the insulating layer and the surface of the second source electrode and the difference in height between the part of the surface of the insulating layer and the surface of the second drain electrode are 5 nm or more. Note that in the above semiconductor device, the difference in height between the part of the surface of the insulating layer and the surface of the second source electrode and the difference in height between the part of the surface of the insulating layer and the surface of the second drain electrode may be 20 nm or less.

Another embodiment of the disclosed invention is a method for manufacturing a semiconductor device, including the steps of: forming a source electrode and a drain electrode over a surface with a root-mean-square roughness of 1 nm or less; forming an insulating layer so as to cover the source electrode and the drain electrode; performing planarization treatment of a surface of the insulating layer, thereby forming a planarized insulating layer having a surface with a root-mean-square roughness of 1 nm or less; forming an opening reaching the source electrode and the drain electrode in the planarized insulating layer, so that the difference in height between a part of the surface of the planarized insulating layer and a surface of the source electrode and the difference in height between the part of the surface of the planarized insulating layer and a surface of the drain electrode are 5 nm or more; forming an oxide semiconductor layer in contact with the part of the surface of the planarized insulating layer, a part of the surface of the source electrode, and a part of the surface of the drain electrode; forming a gate insulating layer so as to cover the oxide semiconductor layer; and forming a gate electrode over the gate insulating layer.

Another embodiment is a method for manufacturing a semiconductor device, including the steps of: forming a source electrode and a drain electrode over a surface with a root-mean-square roughness of 1 nm or less; forming an insulating layer so as to cover the source electrode and the drain electrode; performing planarization treatment of a surface of the insulating layer, thereby forming a planarized insulating layer having a surface with a root-mean-square roughness of 1 nm or less and exposing the source electrode and the drain electrode; thinning the source electrode and the drain electrode so that the difference in height between a part of the surface of the planarized insulating layer and a surface of the source electrode and the difference in height between the part of the surface of the planarized insulating layer and a surface of the drain electrode are 5 nm or more; forming an oxide semiconductor layer in contact with the part of the surface of the planarized insulating layer, a part of the surface of the source electrode, and a part of the surface of the drain electrode; forming a gate insulating layer so as to cover the oxide semiconductor layer; and forming a gate electrode over the gate insulating layer. Note that in the above method for manufacturing a semiconductor device, the difference in height between the part of the surface of the planarized insulating layer and the surface of the source electrode and the difference in height between the part of the surface of the planarized insulating layer and the surface of the drain electrode may be 20 nm or less.

Another embodiment of the disclosed invention is a method for manufacturing a semiconductor device, including the steps of: forming a first transistor including a channel formation region, a first gate insulating layer over the channel formation region, a first gate electrode over the first gate insulating layer, overlapping with the channel formation region, and a first source electrode and a first drain electrode electrically connected to the channel formation region; forming a first insulating layer having a surface with a root-mean-square roughness of 1 nm or less so as to cover the first transistor; forming a second source electrode and a second drain electrode over the surface of the first insulating layer; forming a second insulating layer so as to cover the second source electrode and the second drain electrode; performing planarization treatment of a surface of the second insulating layer, thereby forming a planarized insulating layer having a surface with a root-mean-square roughness of 1 nm or less; forming an opening reaching the second source electrode and the second drain electrode in the planarized insulating layer, so that the difference in height between a part of the surface of the planarized insulating layer and a surface of the second source electrode and the difference in height between the part of the surface of the planarized insulating layer and a surface of the second drain electrode are 5 nm or more; forming an oxide semiconductor layer in contact with the part of the surface of the planarized insulating layer, a part of the surface of the second source electrode, and a part of the surface of the second drain electrode; forming a second gate insulating layer so as to cover the oxide semiconductor layer; and forming a second gate electrode over the second gate insulating layer.

Another embodiment is a method for manufacturing a semiconductor device, including the steps of: forming a first transistor including a channel formation region, a first gate insulating layer over the channel formation region, a first gate electrode over the first gate insulating layer, overlapping with the channel formation region, and a first source electrode and a first drain electrode electrically connected to the channel formation region; forming a first insulating layer having a surface with a root-mean-square roughness of 1 nm or less so as to cover the first transistor; forming a second source electrode and a second drain electrode over the surface of the first insulating layer; forming a second insulating layer so as to cover the second source electrode and the second drain electrode; performing planarization treatment of a surface of the second insulating layer, thereby forming a planarized insulating layer having a surface with a root-mean-square roughness of 1 nm or less and exposing the second source electrode and the second drain electrode; thinning the second source electrode and the second drain electrode so that the difference in height between a part of the surface of the planarized insulating layer and a surface of the second source electrode and the difference in height between the part of the surface of the planarized insulating layer and a surface of the second drain electrode are 5 nm or more; forming an oxide semiconductor layer in contact with the part of the surface of the planarized insulating layer, a part of the surface of the second source electrode, and a part of the surface of the second drain electrode; forming a second gate insulating layer so as to cover the oxide semiconductor layer; and forming a second gate electrode over the second gate insulating layer. Note that in the above method for manufacturing a semiconductor device, the difference in height between the part of the surface of the planarized insulating layer and the surface of the second source electrode and the difference in height between the part of the surface of the planarized insulating layer and the surface of the second drain electrode may be 20 nm or less.

Note that the channel length L of the transistor is preferably less than 2 μm, further preferably, 10 nm to 350 nm (0.35 μm). The thickness of the oxide semiconductor layer is in the range of 1 nm to 50 nm, preferably, 2 nm to 20 nm, further preferably, 3 nm to 15 nm With such a structure, a semiconductor device which operates at high speed and consumes less power can be achieved. For the gate insulating layer, a high dielectric constant material such as hafnium oxide is used. For example, the relative permittivity of hafnium oxide is approximately 15, which is much higher than that of silicon oxide which is 3 to 4. With such a material, a gate insulating layer where the equivalent oxide thickness is less than 15 nm, preferably 2 nm to 10 nm, can be easily formed. In other words, the semiconductor device can be easily miniaturized. Further, as the oxide semiconductor layer, an intrinsic oxide semiconductor which is purified is used. With such an oxide semiconductor, the carrier density of the oxide semiconductor layer can be, for example, less than $1 \times 10^{12}/cm^3$, preferably, less than $1.45 \times 10^{10}/cm^3$, the off-state current of the transistor can be 100 zA/μm (1 zA (zeptoampere) is $1 \times 10^{-21}$ A) or less, preferably, 10 zA/μm or less, and the S value of the transistor can be 65 mV/dec or less, preferably, less than 63 mV/dec. When the above structure is employed, the off-state current of the transistor can be $1 \times 10^{-24}$ A/μm to $1 \times 10^{-30}$ A/μm in theory. The gate electrode may be provided to overlap with the source electrode and the drain electrode, and alternatively, only an end portion of the gate electrode may be provided to overlap with an end portion of the source electrode and an end portion of the drain electrode.

Note that semiconductor devices herein refer to general devices which function by utilizing semiconductor characteristics. For example, a display device, a memory device, an integrated circuit, and the like are included in the category of the semiconductor device.

Note that the term such as "over" or "below" in this specification does not necessarily mean that a component is placed "directly on" or "directly under" another component. For example, the expression "a gate electrode over a gate insulating layer" does not exclude the case where a component is placed between the gate insulating layer and the gate electrode.

In addition, the term such as "electrode" or "wiring" in this specification does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification.

Note that the term "electrically connected" in this specification includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions, as well as an electrode and a wiring.

According to one embodiment of the disclosed invention, a problem caused by miniaturization can be resolved. As a result, the size of the transistor can be sufficiently reduced. By sufficiently downsizing the transistor, an area of a semiconductor device including the transistor is decreased, and the number of semiconductor devices manufactured with one substrate is increased. Therefore, the manufacturing cost per semiconductor device is decreased. Further, since the semiconductor device is downsized, a semiconductor device with a size similar to that of the conventional semiconductor device can have improved functions. Moreover, advantageous effects such as high-speed operation and low power consumption due to a reduction in channel length can be obtained. That is, according to one embodiment of the disclosed invention, miniaturization of a transistor including an oxide semiconductor is achieved, so that a variety of advantageous effects accompanying therewith can be obtained.

As described above, according to one embodiment of the disclosed invention, a semiconductor device which achieves miniaturization as well as suppressing defect or maintaining favorable characteristics can be provided.

BEST MODE FOR CARRYING OUT THE INVENTION

Figure 1A:
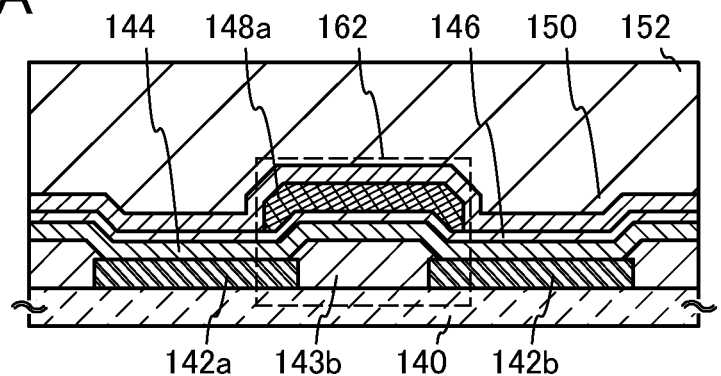
FIGS. 1A to 1C are cross-sectional views each illustrating an example of a structure of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification are used in order to avoid confusion among components, and the terms do not limit the components numerically.

Embodiment 1

In this embodiment, a structure and a manufacturing method of a semiconductor device according to one embodiment of the disclosed invention will be described with reference to FIGS. 1A to 1C, FIGS. 2A to 2G, and FIGS. 3A to 3G.

<Example of Structure of Semiconductor Device>

Figure 1B:
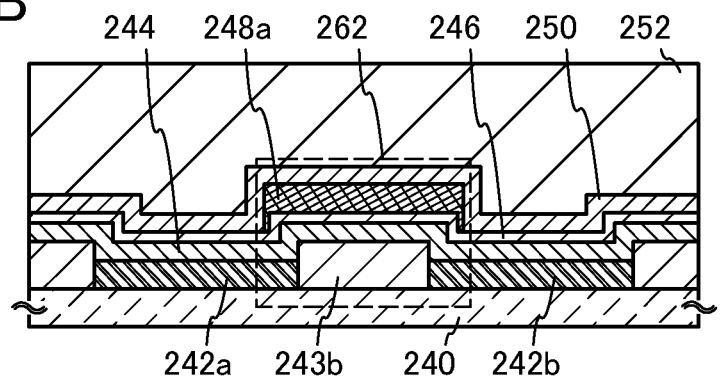
Figure 1C:
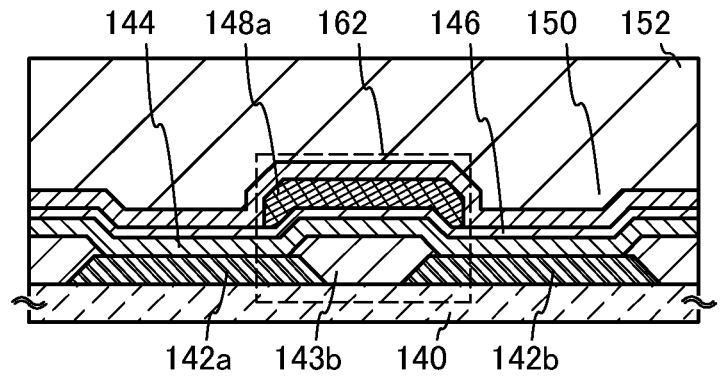

FIGS. 1A to 1C each illustrate an example of a structure of a semiconductor device. FIG. 1A is a first structural example, and FIG. 1B is a second structural example. FIG. 1C is a modified example of FIG. 1A.

A transistor 162 in FIG. 1A includes an insulating layer 143b over a substrate 140 having a surface where components are formed, a source electrode 142a and a drain electrode 142b embedded in an insulating layer including the insulating layer 143b, an oxide semiconductor layer 144 in contact with part of an upper surface of the insulating layer 143b, an upper surface of the source electrode 142a, and an upper surface of the drain electrode 142b, a gate insulating layer 146 covering the oxide semiconductor layer 144, and a gate electrode 148a over the gate insulating layer 146.

With the use of an oxide semiconductor for an active layer of a transistor as illustrated in FIG. 1A, favorable characteristics can be obtained. For example, the S value of a transistor can be 65 mV/dec or less, preferably less than 63 mV/dec.

In addition, part of the upper surface of the insulating layer 143b (particularly referring to a region parallel to the surface where components are formed), which is in contact with the oxide semiconductor layer, has a root-mean-square (RMS) roughness of 1 nm or less (preferably 0.5 nm or less). The difference in height between the part of the upper surface of the insulating layer 143b and the upper surface of the source electrode 142a and the difference in height between the part of the upper surface of the insulating layer 143b and the upper surface of the drain electrode 142b are 5 nm or more.

As described above, in one embodiment of the disclosed invention, a channel formation region of the transistor 162 is provided over a highly flat region with a root-mean-square (RMS) roughness of 1 nm or less. This makes it possible to prevent a problem such as a short-channel effect even in a situation where the transistor 162 is miniaturized and to provide the transistor 162 with favorable characteristics.

In addition, the oxide semiconductor layer 144 can have a uniform thickness by improving the planarity of the surface where components are formed, and the transistor 162 can have improved characteristics. Furthermore, a decrease in coverage which may be caused by a large difference in height can be suppressed, and a disconnection or a defective connection of the oxide semiconductor layer 144 can be prevented.

Moreover, the path of electric current can be extended by making a small difference in height (e.g., 5 nm to 20 nm) between part of the upper surface of the insulating layer 143b and the upper surface of the source electrode 142a and between the part of the upper surface of the insulating layer 143b and the upper surface of the drain electrode 142b. This makes it possible to alleviate the concentration of an electric field in the transistor 162 and to suppress a short-channel effect.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration of the oxide semiconductor layer 144 is measured by secondary ion mass spectrometry (SIMS). The concentration of carriers generated due to a donor such as hydrogen in the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1 \times 10^{12}$/cm$^3$, preferably less than $1 \times 10^{11}$/cm$^3$, more preferably less than $1.45 \times 10^{19}$/cm$^3$. In addition, for example, the off-state current (per unit channel width (1 μm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, the transistor 162 which has extremely favorable off-state current characteristics can be obtained.

Note that as disclosed in Non-Patent Document 7 and the like, a relatively large-size transistor whose channel length is 2 μm to 100 μm can be manufactured with use of an n-type oxide semiconductor having a high carrier density of $2 \times 10^{19}$/cm$^3$. However, when such a material is applied to a miniaturized transistor whose channel length is less than 2 μm, the threshold voltage drastically shifts negatively, and thus it is difficult to realize a normally-off transistor. In other words, the transistor which has a channel length of less than 2 μm and is manufactured using such a material does not work in practice. In contrast, an intrinsic or substantially intrinsic oxide semiconductor which is purified has a carrier density of at most less than $1 \times 10^{14}$/cm$^3$, which does not cause a problem of normally on; thus, with use of such an intrinsic or substantially intrinsic oxide semiconductor, a transistor whose channel length is less than 2 μm can be easily realized.

A transistor 262 in FIG. 1B has a structure similar to that of the transistor 162. That is, the transistor 262 includes an insulating layer 243b over a substrate 240 having a surface where components are formed, a source electrode 242a and a drain electrode 242b embedded in an insulating layer including the insulating layer 243b, an oxide semiconductor layer 244 in contact with part of an upper surface of the insulating layer 243b, an upper surface of the source electrode 242a, and an upper surface of the drain electrode 242b, a gate insulating layer 246 covering the oxide semiconductor layer 244, and a gate electrode 248a over the gate insulating layer 246.

In addition, part of the upper surface of the insulating layer 243b, which is in contact with the oxide semiconductor layer, has a root-mean-square (RMS) roughness of 1 nm or less (preferably 0.5 nm or less). The difference in height between the part of the upper surface of the insulating layer 243b and the upper surface of the source electrode 242a and the difference in height between the part of the upper surface of the insulating layer 243b and the upper surface of the drain electrode 242b are 5 nm or more.

A difference between the transistor 262 in FIG. 1B and the transistor 162 in FIG. 1A is whether or not part of the insulating layer is provided so as to cover end portions of the source electrode and the drain electrode. In other words, the insulating layer 143b of the transistor 162 in FIG. 1A is provided so as to cover the source electrode 142a and the drain electrode 142b, whereas the insulating layer 243b of the transistor 262 in FIG. 1B does not cover the source electrode 242a and the drain electrode 242b.

The effects resulting from the structure in FIG. 1B are similar to those obtained in the case of FIG. 1A. In other words, because a channel formation region of the transistor 262 is provided over a highly flat region, a problem such as a short-channel effect can be prevented even in a situation where the transistor 262 is miniaturized, and the transistor 262 with favorable characteristics can be provided. In addition, the oxide semiconductor layer 244 can have a uniform thickness by improving the planarity of the surface where components are formed, and the transistor 262 can have improved characteristics. Furthermore, a decrease in coverage which may be caused by a large difference in height can be suppressed, and a disconnection or a defective connection of the oxide semiconductor layer 244 can be prevented. Moreover, by making a small difference in height between the insulating layer and the source electrode (and the drain electrode) as described above, the concentration of an electric field in the transistor 262 can be alleviated, and a short-channel effect can be suppressed.

A transistor 162 in FIG. 1C is a modified example of the transistor 162 in FIG. 1A. Specifically, the transistor 162 in FIG. 1C corresponds to a transistor obtained by modifying the source electrode 142a and the drain electrode 142b in FIG. 1A into a tapered shape. The taper angle can be, for example, greater than or equal to 30° and less than or equal to 60°. Note that the "taper angle" means an angle formed by the side surface and the bottom surface of a layer having a tapered shape (for example, the source electrode 142a) when observed from a direction perpendicular to a cross section thereof (a plane perpendicular to a surface of the substrate 140).

<Example of Method for Manufacturing Semiconductor Device>

Next, an example of a method for manufacturing the semiconductor device will be described with reference to FIGS. 2A to 2G and FIGS. 3A to 3G. Here, FIGS. 2A to 2G illustrate an example of a method for manufacturing the transistor 162 shown in FIG. 1A, and FIGS. 3A to 3G illustrate an example of a method for manufacturing the transistor 262 shown in FIG. 1B. Note that FIGS. 2A to 2G will first be described below, and then, for FIGS. 3A to 3G, only a main difference from FIGS. 2A to 2G will be described. In addition, the structure shown in FIG. 1C can be manufactured in a manner similar to that of the structure shown in FIG. 1A; thus, the detailed description thereof is omitted.

FIGS. 2A to 2G will be described below. First, the source electrode 142a and the drain electrode 142b are formed over the substrate 140 having a surface where components are formed (see FIG. 2A).

Although there is no particular limitation on a substrate which can be used as the substrate 140, it is necessary that the substrate 140 has at least heat resistance high enough to withstand heat treatment to be performed later. For example, the substrate may be a glass substrate, a ceramic substrate, a quartz substrate, a sapphire substrate, or the like. Alternatively, the substrate may be a single crystal semiconductor substrate or a polycrystalline semiconductor substrate of silicon, silicon carbide, or the like, a compound semiconductor substrate of silicon germanium or the like, an SOI substrate, or the like as long as the substrate has an insulating surface. Still alternatively, the substrate may be any of these substrates provided with a semiconductor element. Still alternatively, the substrate 140 may be provided with a base film.

Note that the preferred surface of the substrate 140 where components are formed is a sufficiently flat surface. For example, a surface with a root-mean-square roughness (RMS) of 1 nm or less (preferably 0.5 nm or less) is employed. When the transistor 162 is formed over such a surface, the characteristics can be sufficiently improved. In the case where the surface of the substrate 140 has poor flatness, it is desirable that the surface be subjected to chemical mechanical polishing (CMP) treatment, etching treatment, or the like so as to have the above flatness. Note that, for the details of the CMP treatment, the description of CMP treatment for an insulating layer 143 mentioned below can be referred to.

The source electrode 142a and the drain electrode 142b can be formed by forming a conductive layer over the substrate 140 having a surface where components are formed and then selectively etching the conductive layer.

The above conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, or scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source electrode 142a and the drain electrode 142b having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

Although either dry etching or wet etching may be performed as the etching of the conductive layer, dry etching with high controllability is preferably used for miniaturization. The etching may be performed so that the source electrode 142a and the drain electrode 142b to be formed have a tapered shape. The taper angle can be, for example, greater than or equal to 30° and less than or equal to 60°.

The channel length (L) of the transistor 162 is determined by a distance between upper edge portions of the source electrode 142a and the drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet light is high and the depth of focus is large. For these reasons, the channel length (L) of the transistor to be formed later can be set to less than 2 µm, preferably in the range of 10 nm to 350 nm (0.35 µm), in which case the circuit can operate at higher speed. In addition, power consumption of the semiconductor device can be reduced by miniaturization.

Figure 2A:
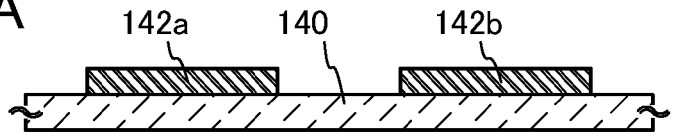
FIGS. 2A to 2G are cross-sectional views illustrating a manufacturing process of a semiconductor device.
Figure 2B:
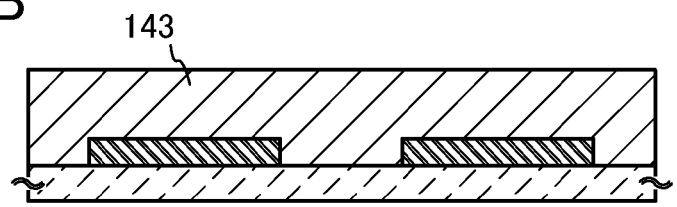

Next, the insulating layer 143 is formed so as to cover the source electrode 142a and the drain electrode 142b (see FIG. 2B).

The insulating layer 143 can be formed using an inorganic insulating material such as silicon oxide, silicon oxynitride, silicon nitride, or aluminum oxide. It is particularly preferable that the insulating layer 143 be formed using silicon oxide because the oxide semiconductor layer 144 formed later is in contact with the insulating layer 143. Although there is no particular limitation on the forming method of the insulating layer 143, in consideration of contact with the oxide semiconductor layer 144, a method in which hydrogen is sufficiently reduced is preferably employed. Examples of such a method include a sputtering method and the like. Needless to say, another deposition method such as a plasma CVD method may be used.

Figure 2C:
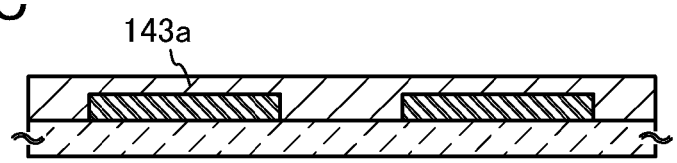

Next, an insulating layer 143a is formed by thinning the insulating layer 143 by chemical mechanical polishing (CMP) treatment (see FIG. 2C). Here, the CMP treatment is performed under such conditions that the surfaces of the source electrode 142a and the drain electrode 142b remain unexposed. In addition, the CMP treatment is performed under such conditions that the root-mean-square (RMS) roughness of a surface of the insulating layer 143a becomes 1 nm or less (preferably 0.5 nm or less). By the CMP treatment performed under such conditions, the planarity of a surface where the oxide semiconductor layer 144 is formed later can be improved, and the characteristics of the transistor 162 can be improved.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, it is preferable that first polishing be performed at a high polishing rate and final polishing be performed at a low polishing rate. By performing polishing at different polishing rates, the planarity of the surface of the insulating layer 143a can be further improved.

Figure 2D:
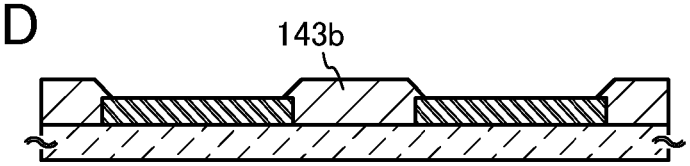

Next, the insulating layer 143b having openings reaching the source electrode 142a and the drain electrode 142b is formed by selectively removing regions of the insulating layer 143a, which overlap with the source electrode 142a and the drain electrode 142b (see FIG. 2D). The insulating layer 143a can be selectively removed by a method such as etching.

The insulating layer 143a may be etched by either dry etching or wet etching. Further, the insulating layer 143a is preferably etched so that the openings to be formed have an inclined surface. The inclined surface preferably has an angle formed with the surface of the substrate 140 and the inclined surface greater than or equal to 30° and less than or equal to 60° when seen from a direction perpendicular to a cross section (a plane perpendicular to the surface of the substrate 140) of the inclined surface. By etching the insulating layer 143*a* under such conditions, coverage with the oxide semiconductor layer to be formed later so as to cover the insulating layer 143*b* is increased, so that a disconnection of the oxide semiconductor layer or the like can be prevented.

By the above etching step, a surface having a small difference in height (e.g., 5 nm to 20 nm) is formed by part of an upper surface of the insulating layer 143*b*, an upper surface of the source electrode 142*a*, and an upper surface of the drain electrode 142*b*. In addition, end portions of the source electrode 142*a* and the drain electrode 142*b* are covered with the insulating layer 143*b*. Note that, with a higher patterning accuracy in forming the openings, it is possible to obtain a structure in which end portions of the source electrode 142*a* and the drain electrode 142*b* are not covered with the insulating layer 143*b*.

Figure 2E:
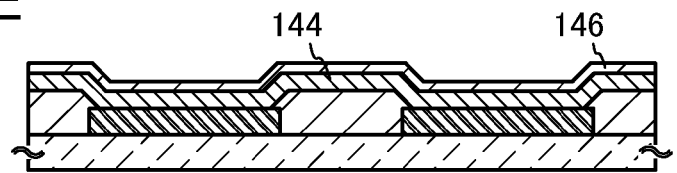

Next, the oxide semiconductor layer 144 covering the above-described surface is formed in contact with part of the source electrode 142*a*, the drain electrode 142*b*, and the insulating layer 143*b*; then, the gate insulating layer 146 is formed so as to cover the oxide semiconductor layer 144 (see FIG. 2E).

The oxide semiconductor layer 144 contains at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have, and are mere examples.

In the case where an In—Zn—O-based material is used as an oxide semiconductor, a target therefore has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

As a target used for forming the oxide semiconductor layer 144 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of $In_2O_3$:$Ga_2O_3$:ZnO=1:1:2 [molar ratio] or the like can be used. Furthermore, a target having a composition ratio of $In_2O_3$:$Ga_2O_3$:ZnO=1:1:1 [molar ratio], a target having a composition ratio of $In_2O_3$:$Ga_2O_3$:ZnO=1:1:4 [molar ratio], or a target having a composition ratio of $In_2O_3$:$Ga_2O_3$:ZnO=1:0:2 [molar ratio] can also be used.

In this embodiment, the oxide semiconductor layer 144 having an amorphous structure is formed by a sputtering method with the use of an In—Ga—Zn—O-based metal oxide target. The thickness ranges from 1 nm to 50 nm, preferably from 2 nm to 20 nm, more preferably from 3 nm to 15 nm.

The relative density of the metal oxide in the metal oxide target is 80% or more, preferably 95% or more, and more preferably 99.9% or more. The use of the metal oxide target having high relative density makes it possible to form an oxide semiconductor layer having a dense structure.

The atmosphere in which the oxide semiconductor layer 144 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to 1 ppm or less (preferably, 10 ppb or less).

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (25° C.±10° C. (higher than or equal to 15° C. and lower than or equal to 35° C.)). Then, moisture in the treatment chamber is removed, a sputtering gas from which hydrogen, water, or the like has been removed is introduced, and the above-described target is used; thus, the oxide semiconductor layer 144 is formed. By forming the oxide semiconductor layer 144 while heating the object to be processed, an impurity in the oxide semiconductor layer 144 can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbo pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer 144 can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (powder or flake-like substances formed at the time of the film formation) can be reduced and the film thickness can be made uniform. The thickness of the oxide semiconductor layer 144 is set in the range of 1 nm to 50 nm, preferably 2 nm to 20 nm, more preferably 3 nm to 15 nm. By employing a structure according to the disclosed invention, a short-channel effect due to miniaturization can be suppressed even in the case of using the oxide semiconductor layer 144 having such a thickness. Note that the appropriate thickness of the oxide semiconductor layer differs depending on the oxide semiconductor material used, the intended use of the semiconductor device, or the like; therefore, the thickness can be determined as appropriate in accordance with the material, the intended use, or the like. Note that a surface where the oxide semiconductor layer 144 is formed is sufficiently planarized in one embodiment of the disclosed invention. Therefore, even an oxide semiconductor layer having a small thickness can be favorably formed.

Note that before the oxide semiconductor layer 144 is formed by a sputtering method, reverse sputtering in which plasma is generated with an argon gas introduced may be performed so that a material attached to a surface where the oxide semiconductor layer 144 is to be formed (e.g., a surface of the insulating layer 143b) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After the oxide semiconductor layer 144 is formed, heat treatment (first heat treatment) is preferably performed on the oxide semiconductor layer 144. Through the first heat treatment, excess hydrogen (including water or a hydroxyl group) in the oxide semiconductor layer 144 can be removed, the structure of the oxide semiconductor layer 144 can be ordered, and defect states in an energy gap can be reduced. For example, the temperature of the first heat treatment is set higher than or equal to 300° C. and lower than 550° C., or higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for performing heat treatment using a high-temperature gas. As the gas, an inert gas that does not react with an object to be processed by heat treatment, for example, nitrogen or a rare gas such as argon, is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the gate insulating layer 146 is formed, or after a gate electrode is formed. Such dehydration treatment or dehydrogenation treatment may be performed once or plural times.

After the oxide semiconductor layer 144 is formed, the oxide semiconductor layer 144 may be processed into an island-shaped oxide semiconductor layer. The oxide semiconductor layer 144 can be processed into an island-shaped oxide semiconductor layer by etching, for example. The etching may be performed either before the heat treatment or after the heat treatment. Dry etching is preferably used in terms of element miniaturization, but wet etching may be used. An etching gas or an etchant can be selected as appropriate depending on a material to be etched.

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be 1 nm to 100 nm, preferably 10 nm to 50 nm.

When the gate insulating layer is thin as described above, gate leakage due to a tunnel effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The use of a high-k material for the gate insulating layer 146 makes it possible to increase the thickness in order to suppress gate leakage as well as ensuring electrical properties. For example, the relative permittivity of hafnium oxide is approximately 15, which is much higher than that of silicon oxide which is 3 to 4. With such a material, a gate insulating layer where the equivalent oxide thickness is less than 15 nm, preferably 2 nm to 10 nm, can be easily formed. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, the oxide semiconductor layer 144 which is i-type (intrinsic) or substantially i-type can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as not to contain impurities other than main components as little as possible.

Figure 2F:
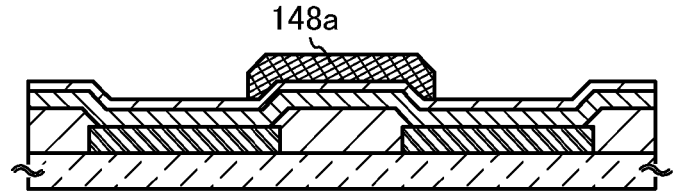

Next, the gate electrode 148a is formed over the gate insulating layer 146 (see FIG. 2F). The gate electrode 148a can be formed by forming a conductive layer over the gate insulating layer 146 and then selectively etching the conductive layer. The conductive layer to be the gate electrode 148a can be formed by a PVD method such as a sputtering method, or a CVD method such as a plasma CVD method. The details are similar to those in the case of the source electrode 142a, the drain electrode 142b, or the like; thus, the description thereof can be referred to. Note that although part of the gate electrode 148a overlaps with the source electrode 142a and the drain electrode 142b in the structure employed here, the disclosed invention is not limited to this structure. It is possible to employ a structure in which an end portion of the gate electrode 148a and an end portion of the source electrode 142a overlap with each other, and an end portion of the gate electrode 148a and an end portion of the drain electrode 142b overlap with each other.

Figure 2G:
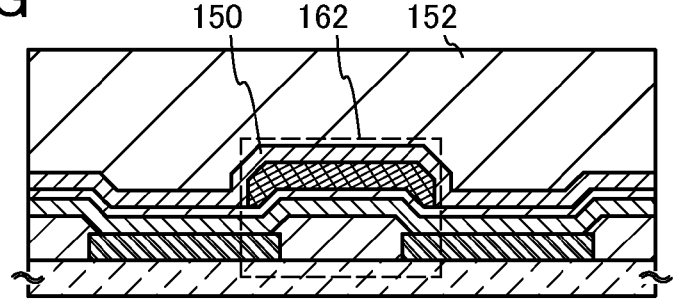

Next, an insulating layer 150 and an insulating layer 152 are formed so as to cover the gate insulating layer 146, the gate electrode 148a, and the like (see FIG. 2G). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that the insulating layer 150 and the insulating layer 152 are preferably formed using a low dielectric constant material or a low dielectric constant structure (such as a porous structure). This is because when the insulating layer 150 and the insulating layer 152 have a low dielectric constant, capacitance generated between wirings, electrodes, or the like can be reduced and operation at higher speed can be achieved.

Note that although a stacked-layer structure of the insulating layer 150 and the insulating layer 152 is used in this embodiment, an embodiment of the disclosed invention is not limited to this example. A single-layer structure or a stacked-layer structure including three or more layers can also be used. Alternatively, a structure in which the insulating layers are not provided is also possible.

Note that the insulating layer 152 is desirably formed so as to have a flat surface. This is because when the insulating layer 152 has a flat surface, an electrode, a wiring, or the like can be favorably formed over the insulating layer 152 even in the case where the semiconductor device or the like is miniaturized. Note that the insulating layer 152 can be planarized using a method such as chemical mechanical polishing (CMP).

Through the above steps, the transistor 162 including the oxide semiconductor layer 144, which is purified, is completed (see FIG. 2G).

Note that a variety of wirings, electrodes, or the like may be formed after the above steps. The wirings or the electrodes can be formed by a method such as a so-called damascene method or dual damascene method.

As described above, in one embodiment of the disclosed invention, a channel formation region of the transistor 162 is provided over a highly flat region with a root-mean-square (RMS) roughness of 1 nm or less. This makes it possible to prevent a problem such as a short-channel effect even in a situation where the transistor 162 is miniaturized and to obtain the transistor 162 with favorable characteristics.

In addition, the oxide semiconductor layer 144 can have a uniform thickness by improving the planarity of the surface where components are formed, and the transistor 162 can have improved characteristics. Furthermore, a decrease in coverage which may be caused by a large difference in height can be suppressed, and a disconnection or a defective connection of the oxide semiconductor layer 144 can be prevented.

Moreover, the path of electric current can be extended by making a small difference in height (e.g., 5 nm to 20 nm) between part of the upper surface of the insulating layer 143b and the upper surface of the source electrode 142a and between the part of the upper surface of the insulating layer 143b and the upper surface of the drain electrode 142b. This makes it possible to alleviate the concentration of an electric field in the transistor 162 and to suppress a short-channel effect.

In the transistor 162 described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the density of carriers generated due to a donor such as hydrogen in the oxide semiconductor layer 144 is, for example, less than $1\times10^{12}/cm^3$, preferably less than $1.45\times10^{10}/cm^3$, which is sufficiently lower than the carrier density of a general silicon wafer (approximately $1\times10^{14}/cm^3$). In addition, the off-state current of the transistor 162 is sufficiently small. For example, the off-state current (per unit channel width (1 µm), here) of the transistor 162 at room temperature (25° C.) is 100 zA (1 zA (zeptoampere) is $1\times10^{-21}$ A) or less, preferably 10 zA or less. When the above structure is employed, the off-state current of the transistor can be $1\times10^{-24}$ A/µm to $1\times10^{-30}$ A/µm in theory.

In this manner, by using the oxide semiconductor layer 144 which is purified and is intrinsic, it becomes easy to sufficiently reduce the off-state current of the transistor. In addition, by using the oxide semiconductor layer 144 which is purified and is intrinsic in this manner, the S value of the transistor can be 65 mV/dec or less, preferably less than 63 mV/dec.

Next, FIGS. 3A to 3G will be described.

Figure 3A:
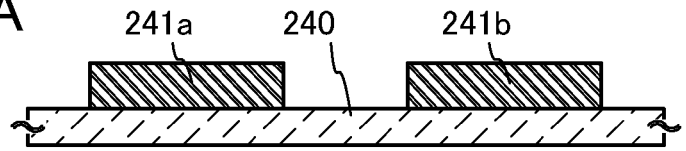
FIGS. 3A to 3G are cross-sectional views illustrating a manufacturing process of a semiconductor device.
Figure 3B:
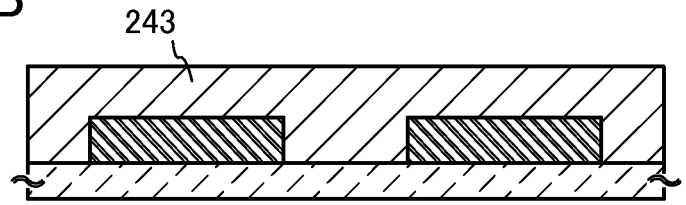

In a manner similar to the case of FIGS. 2A to 2G, first, a conductive layer 241a to be a source electrode later and a conductive layer 241b to be a drain electrode later are formed over the substrate 240 having a surface where components are formed (see FIG. 3A). Then, an insulating layer 243 is formed so as to cover the conductive layer 241a and the conductive layer 241b (see FIG. 3B). The details are similar to those in the case of FIGS. 2A and 2B.

Figure 3C:
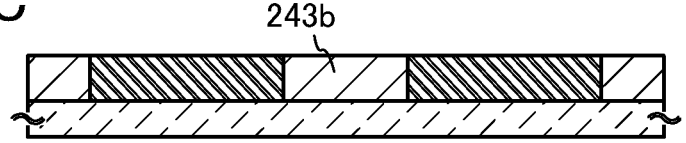

Next, the insulating layer 243b is formed by thinning the insulating layer 243 by chemical mechanical polishing (CMP) treatment (see FIG. 3C). A difference from the case in FIG. 2C is to perform the CMP treatment under such conditions that surfaces of the conductive layer 241a and the conductive layer 241b become exposed. The other conditions for the CMP treatment are similar to those in the case of FIG. 2C. For details, the description about FIG. 2C can be referred to.

Figure 3D:
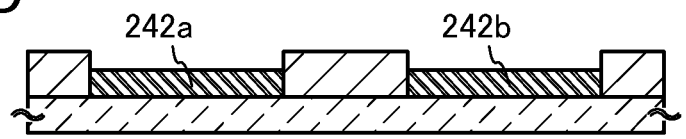

Next, the source electrode 242a and the drain electrode 242b are formed by thinning the conductive layer 241a and the conductive layer 241b (see FIG. 3D). The conductive layer 241a and the conductive layer 241b can be thinned by etching. For the etching, either dry etching or wet etching may be employed. Note that in order to ensure a sufficient planarity of the surface of the insulating layer 243b, the etching needs to be performed under such conditions that only conductive layers can be selectively etched. An etching gas or an etchant can be selected as appropriate depending on a material to be etched.

By the above thinning step, a surface having a small difference in height (e.g., 5 nm to 20 nm) is formed by part of an upper surface of the insulating layer 243b, an upper surface of the source electrode 242a, and an upper surface of the drain electrode 242b. In addition, end portions of the source electrode 242a and the drain electrode 242b are not covered with the insulating layer 243b. Note that a side surface of the insulating layer 243b may be inclined with respect to the bottom surface.

Figure 3E:
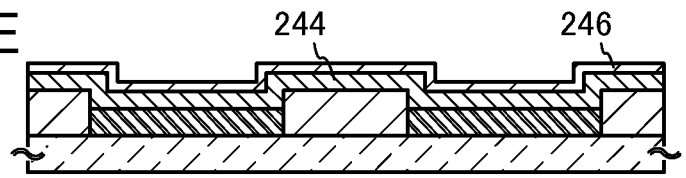
Figure 3F:
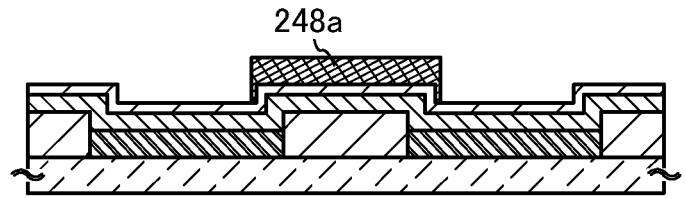
Figure 3G:
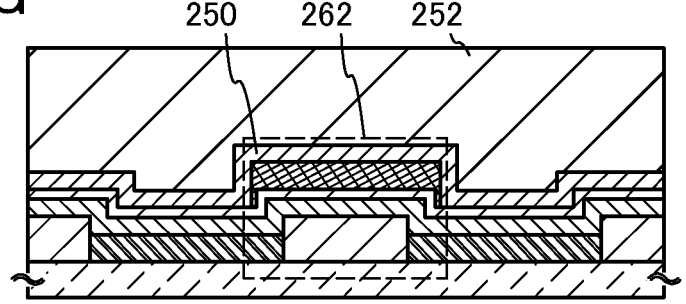

Next, the oxide semiconductor layer 244 covering the above-described surface is formed in contact with part of the source electrode 242a, the drain electrode 242b, and the insulating layer 243b; then, the gate insulating layer 246 is formed so as to cover the oxide semiconductor layer 244 (see FIG. 3E). In addition, the gate electrode 248a is formed over the gate insulating layer 246 (see FIG. 3F). Then, an insulating layer 250 and an insulating layer 252 are formed so as to cover the gate insulating layer 246, the gate electrode 248a, and the like (see FIG. 3G). The details are similar to those in the case of FIGS. 2E to 2G.

The structures, methods, and the like described in this embodiment can be combined as appropriate with any of the structures, methods, and the like described in the other embodiments.

Embodiment 2

In this embodiment, a structure and a manufacturing method of a semiconductor device according to another embodiment of the disclosed invention will be described with reference to FIGS. 4A to 4C, FIGS. 5A to 5D, and FIGS. 6A to 6C. Note that in some circuit diagrams mentioned below, "OS" is written beside a transistor in order to indicate that the transistor includes an oxide semiconductor.

<Example of Structure of Semiconductor Device>

Figure 4A:
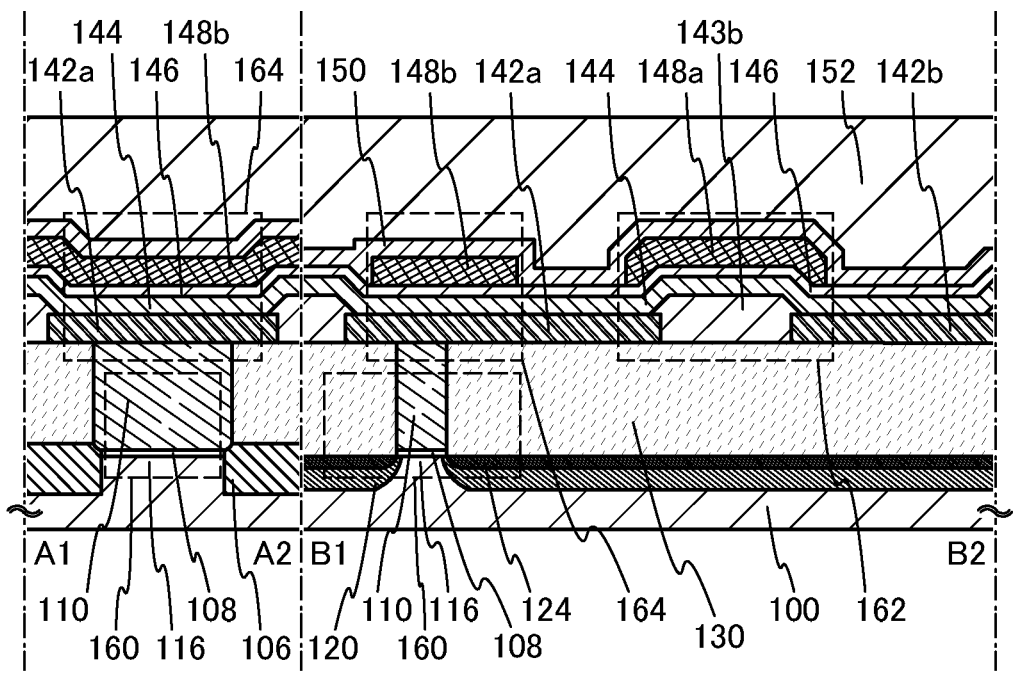
FIGS. 4A to 4C are a cross-sectional view, a plan view, and a circuit diagram illustrating an example of a structure of a semiconductor device.
Figure 4B:
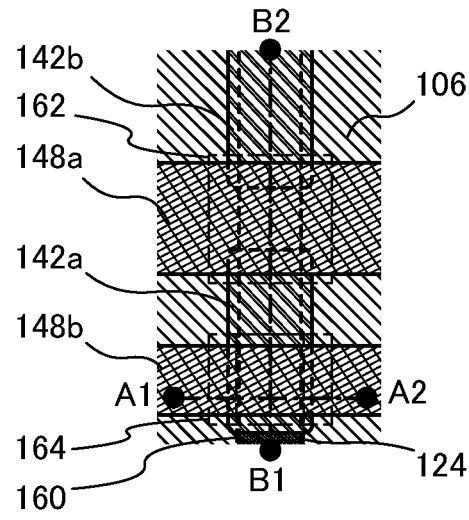
Figure 4C:
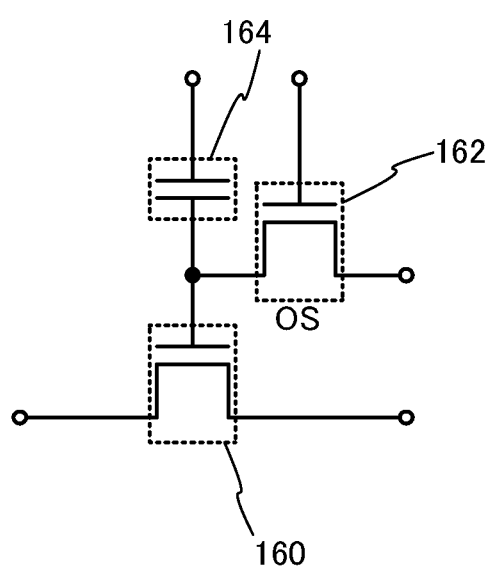

FIGS. 4A to 4C illustrate an example of a structure of a semiconductor device. FIG. 4A is a cross-sectional view of the semiconductor device; FIG. 4B is a plan view of the semiconductor device; and FIG. 4C illustrates a circuit configuration of the semiconductor device. Note that a structure of the semiconductor device is mainly described in this embodiment, and operation of the semiconductor device will be described in detail in an embodiment below. Note that the semiconductor device illustrated in FIGS. 4A to 4C is just an example having predetermined functions and does not represent all semiconductor devices according to the disclosed invention. The semiconductor device according to the disclosed invention can have another function by changing connection relationship of electrodes or the like as appropriate.

FIG. 4A corresponds to a cross-sectional view along line A1-A2 and line B1-B2 in FIG. 4B. The semiconductor device illustrated in FIGS. 4A and 4B includes the transistor 162 described in the above embodiment, a transistor 160 below the transistor 162, and a capacitor 164.

Here, a semiconductor material of the transistor 162 and a semiconductor material of the transistor 160 are preferably different materials. For example, the semiconductor material of the transistor 162 may be an oxide semiconductor, and the semiconductor material of the transistor 160 may be a semiconductor material (such as silicon) other than an oxide semiconductor. A transistor including an oxide semiconductor can hold charge for a long time owing to its characteristics. On the other hand, a transistor including a material other than an oxide semiconductor can operate at high speed easily.

The transistor 160 in FIGS. 4A to 4C includes a channel formation region 116 provided in a substrate 100 including a semiconductor material (such as silicon), impurity regions 120 provided such that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

Further, an element isolation insulating layer 106 is formed over the substrate 100 so as to surround the transistor 160, and an insulating layer 130 is formed to cover the transistor 160. Note that in order to realize higher integration, the transistor 160 preferably has a structure without a sidewall insulating layer as illustrated in FIGS. 4A and 4B. On the other hand, in the case where characteristics of the transistor 160 have priority, a sidewall insulating layer may be provided on a side surface of the gate electrode 110, and the impurity regions 120 may include a region having a different impurity concentration.

The structure of the transistor 162 in FIGS. 4A to 4C is similar to the structure of the transistor 162 in the above embodiment. Note that in this embodiment, the source electrode 142*a* (which may be the drain electrode) of the transistor 162 is connected to the gate electrode 110 of the transistor 160. It is needless to say that the transistor 162 can be replaced with the transistor 262.

The capacitor 164 in FIGS. 4A to 4C includes the source electrode 142*a* (which may be the drain electrode), the oxide semiconductor layer 144, the gate insulating layer 146, and an electrode 148*b*. In other words, the source electrode 142*a* functions as one electrode of the capacitor 164, and the electrode 148*b* functions as the other electrode of the capacitor 164. Note that the electrode 148*b* is formed in a process similar to that of the gate electrode 148*a* of the transistor 162.

Note that in the capacitor 164 of FIGS. 4A to 4C, the oxide semiconductor layer 144 and the gate insulating layer 146 are stacked, whereby insulation between the source electrode 142*a* and the electrode 148*b* can be sufficiently secured. It is needless to say that the capacitor 164 without including the oxide semiconductor layer 144 may be employed in order to secure sufficient capacitance. In addition, in the case where no capacitor is needed, a structure in which the capacitor 164 is not provided is also possible.

In this embodiment, the transistor 162 and the capacitor 164 are provided so as to overlap with the transistor 160. By employing such a planar layout, higher integration can be realized. For example, given that the minimum feature size is F, the area occupied by the semiconductor device can be 15 F² to 25 F².

Note that the structure of a semiconductor device according to the disclosed invention is not limited to that illustrated in FIGS. 4A to 4C. Since the technical idea of the disclosed invention is to form a stacked-layer structure with an oxide semiconductor and a material other than an oxide semiconductor, the details of connection relationship of electrodes or the like can be changed as appropriate.

<Example of Method for Manufacturing Semiconductor Device>

Next, an example of a method for manufacturing the semiconductor device will be described with reference to FIGS. 5A to 5D and FIGS. 6A to 6C. Note that a method for manufacturing the transistor 162 is similar to that in the above embodiment; thus, a method for manufacturing the transistor 160 will be mainly described here.

Figure 5A:
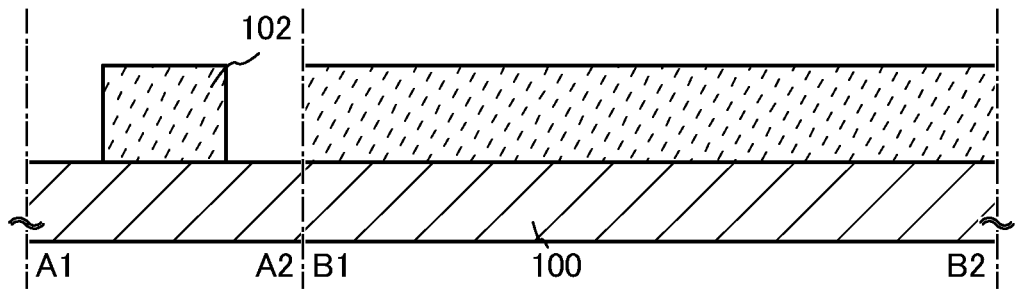
FIGS. 5A to 5D are cross-sectional views illustrating a manufacturing process of a semiconductor device.
Figure 5B:
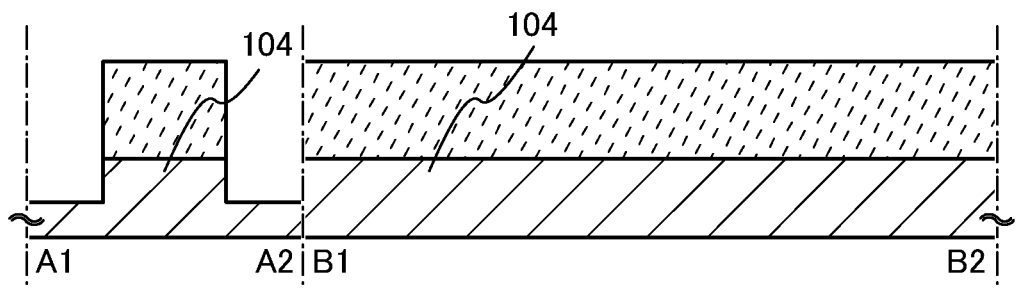

First, the substrate 100 including a semiconductor material is prepared (see FIG. 5A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer interposed therebetween.

It is preferable that a single crystal semiconductor substrate of silicon or the like be particularly used as the substrate 100 including a semiconductor material because the speed of reading operation of the semiconductor device can be increased.

Note that an impurity element may be added to a region which later functions as the channel formation region 116 of the transistor 160, in order to control the threshold voltage of the transistor. Here, an impurity element imparting conductivity is added so that the threshold voltage of the transistor 160 becomes positive. When the semiconductor material is silicon, the impurity imparting conductivity may be boron, aluminum, gallium, or the like. Note that it is preferable to perform heat treatment after adding an impurity element, in order to activate the impurity element or reduce defects which may be generated during addition of the impurity element.

Next, a protective layer 102 serving as a mask for forming an element isolation insulating layer is formed over the substrate 100 (see FIG. 5A). As the protective layer 102, an insulating layer formed using a material such as silicon oxide, silicon nitride, silicon oxynitride, or the like can be used, for example.

Next, part of the substrate 100 in a region not covered with the protective layer 102 (i.e., in an exposed region) is removed by etching using the protective layer 102 as a mask. Thus, a semiconductor region 104 isolated from other semiconductor regions is formed (see FIG. 5B). As the etching, dry etching is preferably performed, but wet etching may be performed. An etching gas or an etchant can be selected as appropriate depending on a material to be etched.

Figure 5C:
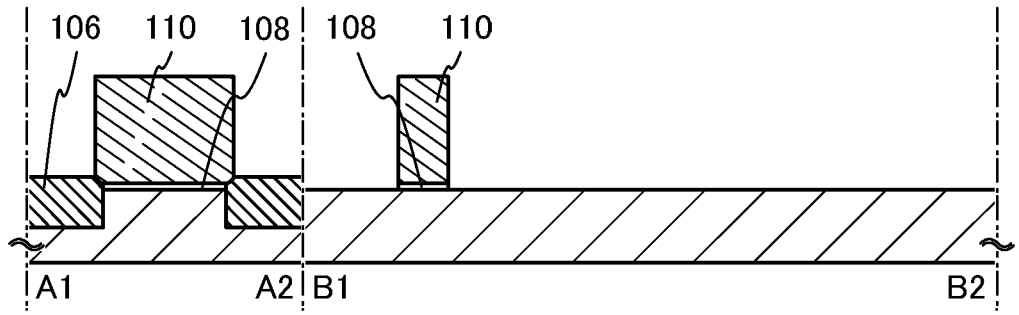

Then, an insulating layer is formed so as to cover the semiconductor region 104, and the insulating layer in a region overlapping with the semiconductor region 104 is selectively removed; thus, the element isolation insulating layer 106 is formed (see FIG. 5C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by heat treatment (thermal oxidation treatment, thermal nitridation treatment, or the like) of the surface of the semiconductor region 104, for example. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like.

The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched; thus, the gate insulating layer 108 and the gate electrode 110 are formed (see FIG. 5C).

Figure 5D:
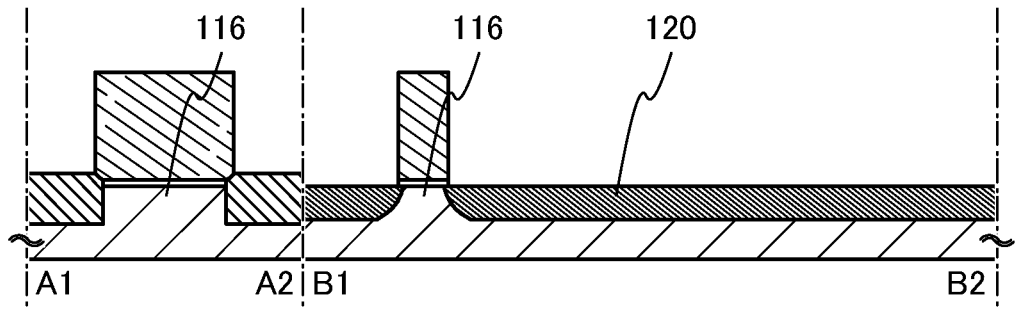

Next, phosphorus (P), arsenic (As), or the like is added to the semiconductor region 104, whereby the channel formation region 116 and the impurity regions 120 are formed (see FIG. 5D). Note that phosphorus or arsenic is added here in order to form an n-type transistor; an impurity element such as boron (B) or aluminum (Al) may be added in the case of forming a p-type transistor. Here, the concentration of the impurity added can be set as appropriate; the concentration is preferably set high when a semiconductor element is highly miniaturized.

Note that a sidewall insulating layer may be formed around the gate electrode 110, and impurity regions to which the impurity element is added at a different concentration may be formed.

Figure 6A:
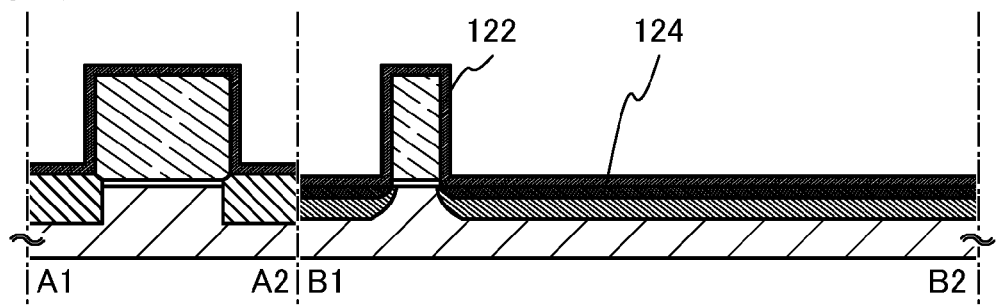
FIGS. 6A to 6C are cross-sectional views illustrating a manufacturing process of a semiconductor device.

Next, a metal layer 122 is formed so as to cover the gate electrode 110, the impurity regions 120, and the like (see FIG. 6A). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material included in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound regions 124 that are in contact with the impurity regions 120 are formed (see FIG. 6A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 6B:
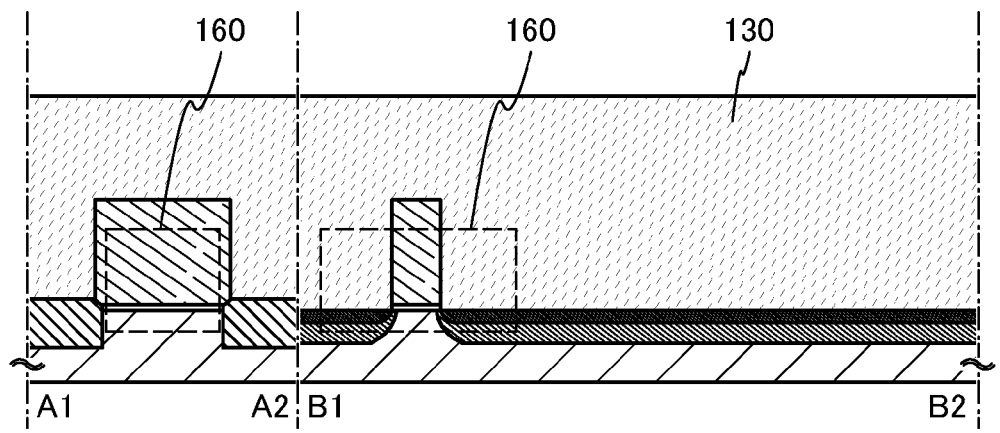

Next, the insulating layer 130 is formed so as to cover the components formed in the above steps (see FIG. 6B). The insulating layer 130 can be formed using an inorganic insulating material such as silicon oxide, silicon oxynitride, silicon nitride, or aluminum oxide. It is particularly preferable to use a low dielectric constant (low-k) material for the insulating layer 130 because capacitance due to overlap of electrodes or wirings can be sufficiently reduced. Note that a porous insulating layer with such a material may be employed as the insulating layer 130. The porous insulating layer has a lower dielectric constant than an insulating layer with high density and thus makes it possible to further reduce capacitance due to electrodes or wirings. Alternatively, the insulating layer 130 can be formed using an organic insulating material such as a polyimide or an acrylic resin. Note that although a single-layer structure of the insulating layer 130 is used in this embodiment, an embodiment of the disclosed invention is not limited to this example. A stacked-layer structure with two or more layers may be employed.

Through the above steps, the transistor 160 is formed with the use of the substrate 100 including a semiconductor material (see FIG. 6B). A feature of the transistor 160 is that it can operate at high speed. With the use of that transistor as a transistor for reading, data can be read at high speed.

Figure 6C:
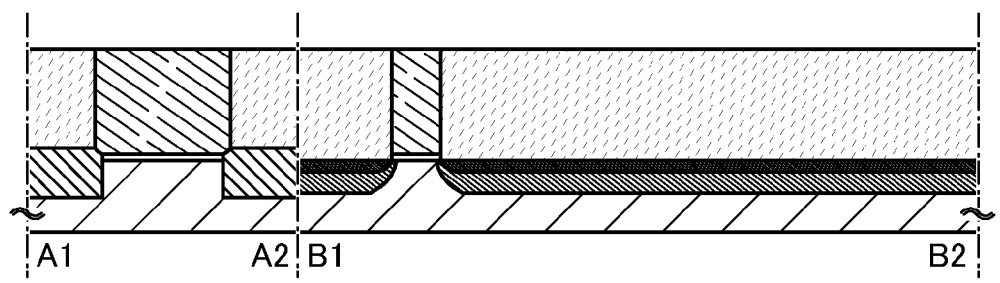

After that, as treatment performed before the transistor 162 and the capacitor 164 are formed, CMP treatment of the insulating layer 130 is performed so that an upper surface of the gate electrode 110 is exposed (see FIG. 6C). As treatment for exposing the upper surface of the gate electrode 110, etching treatment or the like can also be employed instead of CMP treatment; in order to improve characteristics of the transistor 162, a surface of the insulating layer 130 is preferably made as flat as possible. For example, the insulating layer 130 is planarized such that its surface has a root-mean-square (RMS) roughness of 1 nm or less. This makes it possible to improve characteristics of a semiconductor device formed over the insulating layer 130.

Note that before or after each of the above steps, a step of forming an electrode, a wiring, a semiconductor layer, an insulating layer, or the like may be further performed. For example, when the wiring has a multi-layer structure of a stacked-layer structure including insulating layers and conductive layers, a highly integrated semiconductor device can be realized.

After that, the transistor 162 and the capacitor 164 are formed; thus, the semiconductor device is completed.

The structures, methods, and the like described in this embodiment can be combined as appropriate with any of the structures, methods, and the like described in the other embodiments.

Embodiment 3

In this embodiment, an example of application of a semiconductor device according to one embodiment of the disclosed invention will be described with reference to FIGS. 7A-1, 7A-2, and 7B. Here, an example of a memory device is described. Note that in some circuit diagrams mentioned below, "OS" is written beside a transistor in order to indicate that the transistor includes an oxide semiconductor.

Figures 1, 7A:
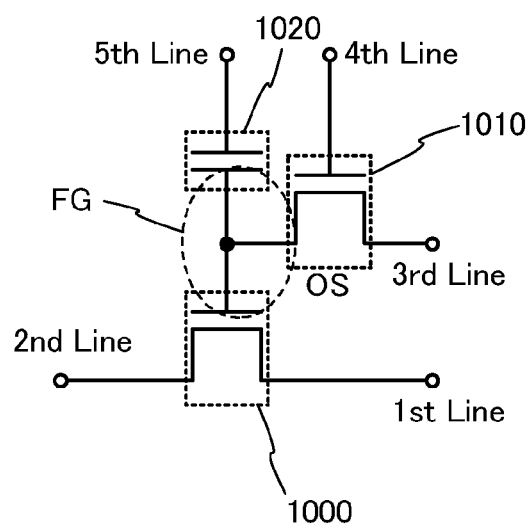
FIGS. 7A-1, 7A-2, and 7B are diagrams illustrating an example of application of a semiconductor device.

In a semiconductor device which can be used as a memory device, which is illustrated in FIG. 7A-1, a first wiring (1st Line) is electrically connected to a source electrode of a transistor 1000. A second wiring (2nd Line) is electrically connected to a drain electrode of the transistor 1000. A third wiring (3rd Line) is electrically connected to one of a source electrode and a drain electrode of a transistor 1010. A fourth wiring (4th Line) is electrically connected to a gate electrode of the transistor 1010. Furthermore, a gate electrode of the transistor 1000 and the other of the source electrode and the drain electrode of the transistor 1010 are electrically connected to one electrode of a capacitor 1020. A fifth wiring (5th Line) is electrically connected to the other electrode of the capacitor 1020.

Here, a transistor including an oxide semiconductor is used as the transistor 1010. Any of the transistors described in the above embodiments can be used as the transistor including an oxide semiconductor. A transistor including an oxide semiconductor has a characteristic of a significantly small off-state current. For that reason, a potential of the gate electrode of the transistor 1000 can be held for an extremely long period even if the transistor 1010 is turned off. Furthermore, with the use of any of the transistors described in the above embodiments, the short-channel effect of the transistor 1010 can be suppressed, and miniaturization can be achieved. By providing the capacitor 1020, holding of charge applied to the gate electrode of the transistor 1000 and reading of data held can be performed more easily. Here, the capacitor described in the above embodiment can be used as the capacitor 1020, for example.

A transistor including a semiconductor material other than an oxide semiconductor is used as the transistor 1000. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at high speed. Here, any of the transistors described in the above embodiments can be used as the transistor including a semiconductor material other than an oxide semiconductor, for example.

Figure 7B:
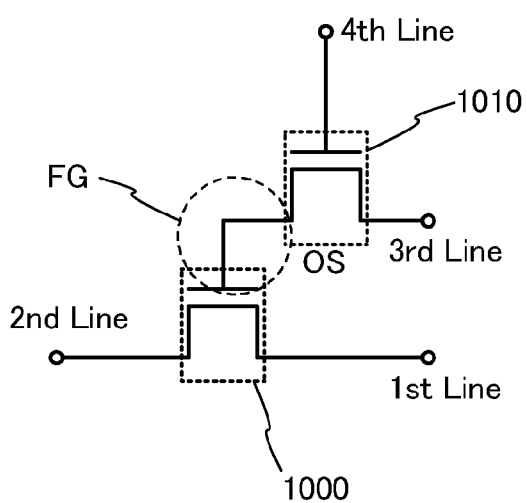

Alternatively, a structure in which the capacitor 1020 is not provided is also possible as illustrated in FIG. 7B.

The semiconductor device in FIG. 7A-1 utilizes a characteristic in which the potential of the gate electrode of the transistor 1000 can be held, and can thus write, hold, and read data as follows.

First of all, writing and holding of data will be described. First, the potential of the fourth wiring is set to a potential at which the transistor 1010 is turned on, so that the transistor 1010 is turned on. Accordingly, the potential of the third wiring is supplied to the gate electrode of the transistor 1000 and to the capacitor 1020. That is, predetermined charge is supplied to the gate electrode of the transistor 1000 (writing). Here, one of two kinds of charges providing different potentials (hereinafter, a charge providing a low potential is referred to as charge $Q_L$ and a charge providing a high potential is referred to as charge $Q_H$) is applied. Note that three or more kinds of charges providing different potentials may be applied in order to improve storage capacity. After that, the potential of the fourth wiring is set to a potential at which the transistor 1010 is turned off, so that the transistor 1010 is turned off. Thus, the charge supplied to the gate electrode of the transistor 1000 is held (holding).

Since the off-state current of the transistor 1010 is significantly small, the charge of the gate electrode of the transistor 1000 is held for a long time.

Next, reading of data will be described. By supplying an appropriate potential (reading potential) to the fifth wiring while a predetermined potential (a constant potential) is supplied to the first wiring, the potential of the second wiring varies depending on the amount of charge held at the gate electrode of the transistor 1000. This is generally because, when the transistor 1000 is an n-channel transistor, an apparent threshold voltage $V_{th\_H}$ in the case where $Q_H$ is supplied to the gate electrode of the transistor 1000 is lower than an apparent threshold voltage $V_{th\_L}$ in the case where $Q_L$ is supplied to the gate electrode of the transistor 1000. Here, an apparent threshold voltage refers to the potential of the fifth wiring, which is needed to turn on the transistor 1000. Thus, the potential of the fifth wiring is set to a potential $V_0$ intermediate between $V_{th\_H}$ and $V_{th\_L}$, whereby charge supplied to the gate electrode of the transistor 1000 can be determined. For example, in the case where $Q_H$ is supplied in writing, when the potential of the fifth wiring is $V_0$ ($>V_{th\_H}$), the transistor 1000 is turned on. In the case where $Q_L$ is supplied in writing, even when the potential of the fifth wiring is $V_0$ ($<V_{th\_L}$), the transistor 1000 remains off. Therefore, the data held can be read by measuring the potential of the second wiring.

Note that in the case where memory cells are arrayed to be used, it is necessary that only data of a desired memory cell can be read. In order to read data of a predetermined memory cell and not to read data of the other memory cells, in the case where the transistors 1000 are connected in parallel among the memory cells, fifth wirings in memory cells that are not a target for reading are supplied with a potential at which the transistors 1000 are turned off regardless of the state of the gate electrodes, that is, a potential lower than $V_{th\_H}$. On the other hand, in the case where the transistors 1000 are connected in series among the memory cells, fifth wirings in memory cells that are not a target for reading are supplied with a potential at which the transistors 1000 are turned on regardless of the state of the gate electrodes, that is, a potential higher than $V_{th\_L}$.

Next, rewriting of data will be described. Rewriting of data is performed in a manner similar to that of the writing and holding of data. That is, the potential of the fourth wiring is set to a potential at which the transistor 1010 is turned on, so that the transistor 1010 is turned on. Accordingly, the potential of the third wiring (a potential for new data) is supplied to the gate electrode of the transistor 1000 and to the capacitor 1020. After that, the potential of the fourth wiring is set to a potential at which the transistor 1010 is turned off, so that the transistor 1010 is turned off. Accordingly, charge for new data is supplied to the gate electrode of the transistor 1000.

In the semiconductor device according to the disclosed invention, data can be directly rewritten by another writing of data as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the source electrode or the drain electrode of the transistor 1010 is electrically connected to the gate electrode of the transistor 1000 and therefore has a function similar to that of a floating gate of a floating gate transistor used for a nonvolatile memory element. Therefore, in drawings, a portion where the source electrode or the drain electrode of the transistor 1010 is electrically connected to the gate electrode of the transistor 1000 is called a floating gate portion FG in some cases. When the transistor 1010 is turned off, the floating gate portion FG can be regarded as being embedded in an insulator and thus charge is held in the floating gate portion FG. The off-state current of the transistor 1010 including an oxide semiconductor is smaller than or equal to 1/100000 of the off-state current of a transistor including a silicon semiconductor or the like; thus, loss of the charge accumulated in the floating gate portion FG due to leakage of the transistor 1010 is negligible. That is, with the transistor 1010 including an oxide semiconductor, a nonvolatile memory device which can hold data without being supplied with power can be realized.

For example, when the off-state current of the transistor 1010 at room temperature is 10 zA (1 zA (zeptoampere) is $1\times10^{-21}$ A) or less and the capacitance of the capacitor 1020 is approximately 10 fF, data can be held for $10^4$ seconds or longer. It is needless to say that the holding time depends on transistor characteristics and capacitance.

Further, in that case, the problem of deterioration of a gate insulating film (tunnel insulating film), which is a problem of a conventional floating gate transistor, does not exist. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figures 2, 7A:
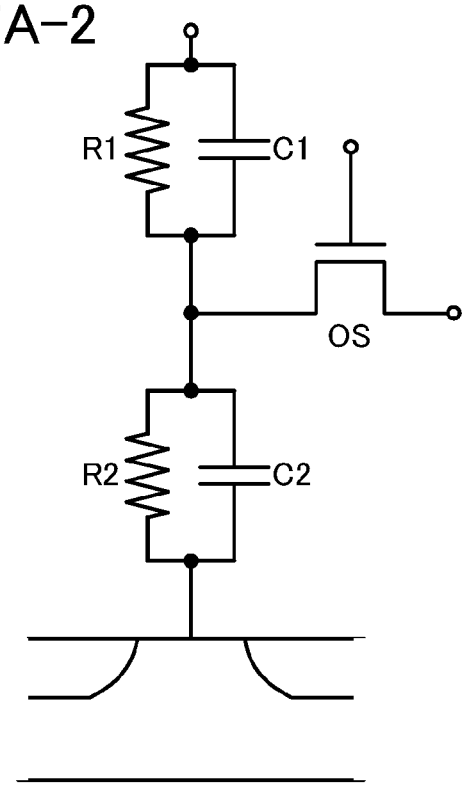

Components such as transistors in the semiconductor device in FIG. 7A-1 can be regarded as including resistors and capacitors as illustrated in FIG. 7A-2. That is, in FIG. 7A-2, the transistor 1000 and the capacitor 1020 are each regarded as including a resistor and a capacitor. R1 and C1 denote the resistance and the capacitance of the capacitor 1020, respectively. The resistance R1 corresponds to the resistance of the insulating layer included in the capacitor 1020. R2 and C2 denote the resistance and the capacitance of the transistor 1000, respectively. The resistance R2 corresponds to the resistance of the gate insulating layer at the time when the transistor 1000 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 1010 under the conditions where the gate leakage current of the transistor 1010 is sufficiently small and R1 and R2 satisfy R1 ROS (R1 is greater than or equal to ROS) and R2 ROS (R2 is greater than or equal to ROS), where ROS is the resistance (also referred to as effective resistance) between the source electrode and the drain electrode in a state where the transistor 1010 is turned off.

On the other hand, in the case where the above conditions are not satisfied, it is difficult to secure a sufficient holding period even if the off-state current of the transistor 1010 is sufficiently small. This is because leakage current other than the off-state current of the transistor 1010 (e.g., leakage current generated between the source electrode and the gate electrode) is large. Accordingly, it can be said that the semiconductor device disclosed in this embodiment preferably satisfies the above relationships.

Meanwhile, it is desirable that C1 and C2 satisfy C1≥C2 (C1 is greater than or equal to C2). This is because if C1 is larger than or equal to C2, when the potential of the floating gate portion FG is controlled by the fifth wiring, the potential of the fifth wiring can be efficiently supplied to the floating gate portion FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 1000 and the insulating layer of the capacitor 1020. The same dependence applies to C1 and C2. Therefore, the material, the thickness, and the like of the gate insulating layer are preferably set as appropriate to satisfy the above relationships.

In the semiconductor device described in this embodiment, the floating gate portion FG has a function similar to a floating gate of a floating gate transistor of a flash memory or the like, but the floating gate portion FG of this embodiment has a feature which is essentially different from that of the floating gate of the flash memory or the like. In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

Further, because of the above principle of a flash memory, deterioration of an insulating film proceeds and thus another problem that is the limit on the number of times of rewriting (approximately $10^4$ to $10^5$ times) arises.

The semiconductor device according to the disclosed invention is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

Further, charge injection by a tunneling current is not employed, which means that there are no causes for deterioration of a memory cell. In other words, the semiconductor device according to the disclosed invention has higher durability and reliability than a flash memory.

In addition, the semiconductor device according to the disclosed invention is advantageous over a flash memory also in that a large step-up circuit or the like is not necessary because a high electric field is not necessary.

In the case where the relative permittivity $\in$r1 of the insulating layer included in the capacitor 1020 is different from the relative permittivity $\in$r2 of the insulating layer included in the transistor 1000, it is easy to satisfy C1≥C2 (C1 is greater than or equal to C2) while satisfying 2·S2≥S1 (2·S2 is greater than or equal to S1), desirably S2≥S1 (S2 is greater than or equal to S1), where S1 is the area of the insulating layer included in the capacitor 1020 and S2 is the area of the insulating layer forming a gate capacitor of the transistor 1000. In other words, C1 can easily be made greater than or equal to C2 while the area of the insulating layer included in the capacitor 1020 is small. Specifically, for example, a film including a high-k material such as hafnium oxide or a stack of a film including a high-k material such as hafnium oxide and a film including an oxide semiconductor is used for the insulating layer included in the capacitor 1020 so that $\in$r1 can be set to 10 or more, preferably 15 or more, and silicon oxide is used for the insulating layer forming the gate capacitor so that 3≤$\in$r2≤4 ($\in$r2 is greater than or equal to 3 and less than or equal to 4).

A combination of such structures enables further higher integration of the semiconductor device according to the disclosed invention.

Note that an n-type transistor (n-channel transistor) in which electrons are majority carriers is used in the above description; it is needless to say that a p-type transistor (p-channel transistor) in which holes are majority carriers can be used instead of the n-type transistor.

As described above, a semiconductor device according to an embodiment of the disclosed invention has a nonvolatile memory cell including a writing transistor where a leakage current (off-state current) between a source and a drain in an off state is small, a reading transistor including a semiconductor material different from that of the writing transistor, and a capacitor.

With a normal silicon semiconductor, it is difficult to decrease the leakage current (the off-state current) to 100 zA ($1\times10^{-19}$ A) or less at ambient temperature (e.g., 25° C.), whereas this value can be achieved with a transistor including an oxide semiconductor which is processed under appropriate conditions. Therefore, a transistor including an oxide semiconductor is preferably used as the writing transistor.

In addition, a transistor including an oxide semiconductor has a small subthreshold swing (S value), so that the switching speed can be sufficiently increased even if the mobility is relatively low. Therefore, by using the transistor as the writing transistor, rising of a writing pulse supplied to the floating gate portion FG can be made very sharp. Further, because of such a small off-state current, the amount of charge required to be held in the floating gate portion FG can be reduced. That is, by using a transistor including an oxide semiconductor as the writing transistor, rewriting of data can be performed at high speed.

There is no limitation on the off-state current of the reading transistor; it is desirable to use a transistor which operates at high speed in order to increase the reading speed. For example, a transistor with a switching speed of 1 nanosecond or less is preferably used as the reading transistor.

In this manner, when a transistor including an oxide semiconductor is used as a writing transistor and a transistor including a semiconductor material other than an oxide semiconductor is used as a reading transistor, a semiconductor device capable of holding data for a long time and reading data at high speed, which can be used as a memory device, can be obtained.

Furthermore, with the use of any of the transistors described in the above embodiments as a writing transistor, the short-channel effect of the writing transistor can be suppressed, and miniaturization can be achieved. Accordingly, a semiconductor device which can be used as a memory device can have higher integration.

The structures, methods, and the like described in this embodiment can be combined as appropriate with any of the structures, methods, and the like described in the other embodiments.

Embodiment 4

In this embodiment, an example of application of a semiconductor device according to one embodiment of the disclosed invention will be described with reference to FIGS. 8A and 8B and FIGS. 9A to 9C. Here, an example of a memory device is described. Note that in some circuit diagrams mentioned below, "OS" is written beside a transistor in order to indicate that the transistor includes an oxide semiconductor.

Figure 8A:
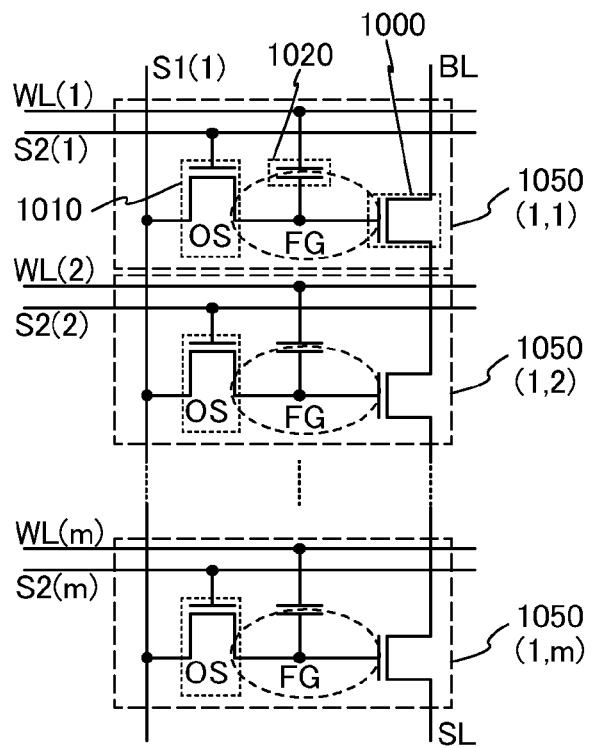
FIGS. 8A and 8B are diagrams illustrating an example of application of a semiconductor device.
Figure 8B:
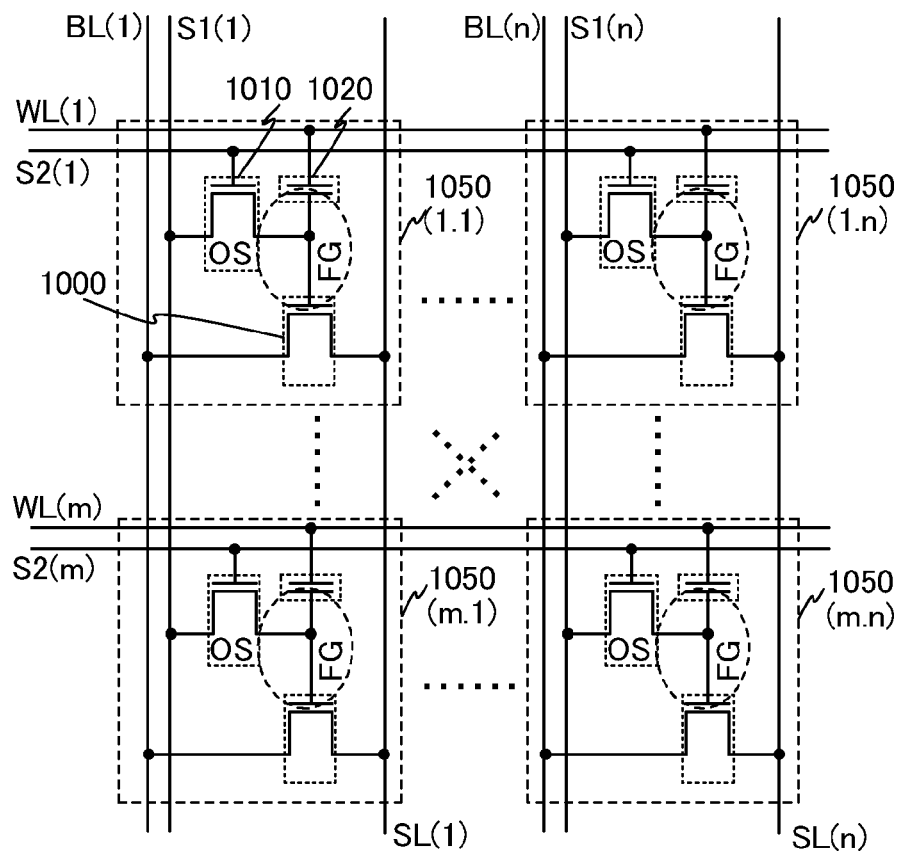

FIGS. 8A and 8B are circuit diagrams of semiconductor devices, which can be used as memory devices, each including a plurality of semiconductor devices (hereinafter also referred to as memory cells 1050) illustrated in FIG. 7A-1. FIG. 8A is a circuit diagram of a so-called NAND semiconductor device in which the memory cells 1050 are connected in series, and FIG. 8B is a circuit diagram of a so-called NOR semiconductor device in which the memory cells 1050 are connected in parallel.

The semiconductor device in FIG. 8A includes a source line SL, a bit line BL, a first signal line S1, m second signal lines S2, m word lines WL, and m memory cells 1050. In FIG. 8A, one source line SL and one bit line BL are provided in the semiconductor device; however, an embodiment of the disclosed invention is not limited to this structure. A plurality of source lines SL and a plurality of bit lines BL may be provided.

In each of the memory cells 1050, the gate electrode of the transistor 1000, one of the source electrode and the drain electrode of the transistor 1010, and one electrode of the capacitor 1020 are electrically connected to one another. The first signal line S1 and the other of the source electrode and the drain electrode of the transistor 1010 are electrically connected to each other, and the second signal line S2 and the gate electrode of the transistor 1010 are electrically connected to each other. The word line WL and the other electrode of the capacitor 1020 are electrically connected to each other.

Further, the source electrode of the transistor 1000 included in the memory cell 1050 is electrically connected to the drain electrode of the transistor 1000 in the adjacent memory cell 1050. The drain electrode of the transistor 1000 included in the memory cell 1050 is electrically connected to the source electrode of the transistor 1000 in the adjacent memory cell 1050. Note that the drain electrode of the transistor 1000 included in the memory cell 1050 at one end of the plurality of memory cells connected in series is electrically connected to the bit line BL. The source electrode of the transistor 1000 included in the memory cell 1050 at the other end of the plurality of memory cells connected in series is electrically connected to the source line SL.

In the semiconductor device in FIG. 8A, writing operation and reading operation are performed for each row. The writing operation is performed as follows. A potential at which the transistor 1010 is turned on is supplied to the second signal line S2 of a row where writing is to be performed, so that the transistor 1010 of the row where writing is to be performed is turned on. Accordingly, a potential of the first signal line S1 is supplied to the gate electrode of the transistor 1000 of the specified row, so that predetermined charge is applied to the gate electrode. Thus, data can be written to the memory cell of the specified row.

Further, the reading operation is performed as follows. First, a potential at which the transistor 1000 is turned on regardless of charge of the gate electrode thereof is supplied to the word lines WL of the rows other than the row where reading is to be performed, so that the transistors 1000 of the rows other than the row where reading is to be performed are turned on. Then, a potential (reading potential) at which an on state or an off state of the transistor 1000 is determined depending on charge of the gate electrode of the transistor 1000 is supplied to the word line WL of the row where reading is to be performed. After that, a constant potential is supplied to the source line SL so that a reading circuit (not illustrated) connected to the bit line BL is operated. Here, the plurality of transistors 1000 between the source line SL and the bit line BL are turned on except the transistor 1000 of the row where reading is to be performed; therefore, conductance between the source line SL and the bit line BL is determined by the state of the transistor 1000 (whether being turned on or off) of the row where reading is to be performed. Since the conductance of the transistor varies depending on the electric charge in the gate electrode of the transistor 1000 of the row where reading is to be performed, a potential of the bit line BL also varies accordingly. By reading the potential of the bit line BL with the reading circuit, data can be read from the memory cell of the specified row.

The semiconductor device in FIG. 8B includes n source lines SL, n bit lines BL, n first signal lines S1, m second signal lines S2, m word lines WL, and n×m memory cells 1050. A gate electrode of the transistor 1000, one of the source electrode and the drain electrode of the transistor 1010, and one electrode of the capacitor 1020 are electrically connected to one another. The source line SL and the source electrode of the transistor 1000 are electrically connected to each other.

The bit line BL and the drain electrode of the transistor 1000 are electrically connected to each other. The first signal line S1 and the other of the source electrode and the drain electrode of the transistor 1010 are electrically connected to each other, and the second signal line S2 and the gate electrode of the transistor 1010 are electrically connected to each other. The word line WL and the other electrode of the capacitor 1020 are electrically connected to each other.

In the semiconductor device in FIG. 8B, writing operation and reading operation are performed for each row. The writing operation is performed in a manner similar to that of the semiconductor device in FIG. 8A. The reading operation is performed as follows. First, a potential at which the transistor 1000 is turned off regardless of charge of the gate electrode thereof is supplied to the word lines WL of the rows other than the row where reading is to be performed, so that the transistors 1000 of the rows other than the row where reading is to be performed are turned off. Then, a potential (reading potential) at which an on state or an off state of the transistor 1000 is determined depending on charge of the gate electrode of the transistor 1000 is supplied to the word line WL of the row where reading is to be performed. After that, a constant potential is supplied to the source line SL so that a reading circuit (not illustrated) connected to the bit line BL is operated. Here, conductance between the source line SL and the bit line BL is determined by the state of the transistor 1000 (whether being turned on or off) of the row where reading is to be performed. That is, a potential of the bit line BL depends on charge of the gate electrode of the transistor 1000 of the row where reading is to be performed. By reading the potential of the bit line BL with the reading circuit, data can be read from the memory cell of the specified row.

Although the amount of data which can be stored in each of the memory cells 1050 is one bit in the above description, the structure of the semiconductor device of this embodiment is not limited to this example. The amount of data which is held in each of the memory cells 1050 may be increased by preparing three or more kinds of potentials to be supplied to the gate electrode of the transistor 1000. For example, in the case where four kinds of potentials are supplied to the gate electrode of the transistor 1000, data of two bits can be held in each of the memory cells.

Next, an example of a reading circuit which can be used for the semiconductor devices illustrated in FIGS. 8A and 8B and the like will be described with reference to FIGS. 9A to 9C.

Figure 9A:
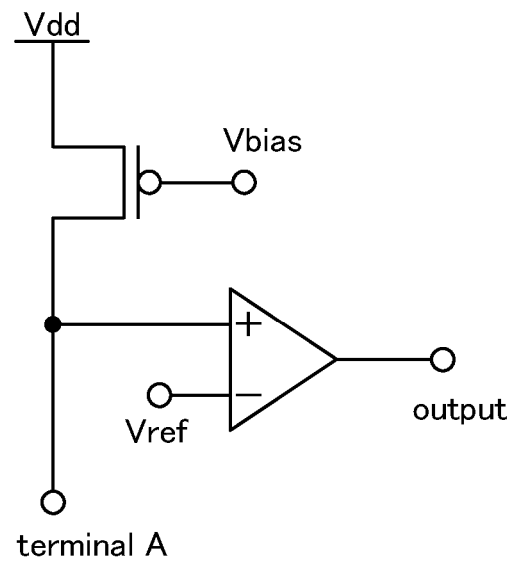
FIGS. 9A to 9C are diagrams illustrating an example of application of a semiconductor device.

FIG. 9A illustrates an outline of the reading circuit. The reading circuit includes a transistor and a sense amplifier circuit.

At the time of reading data, a terminal A is connected to a bit line BL to which a memory cell from which data is to be read is connected. Further, a bias potential Vbias is applied to a gate electrode of the transistor so that a potential of the terminal A is controlled.

The resistance of the memory cell 1050 varies depending on data stored. Specifically, when the transistor 1000 of the memory cell 1050 selected is turned on, the memory cell 1050 has a low resistance, whereas when the transistor 1000 of the memory cell 1050 selected is turned off, the memory cell 1050 has a high resistance.

When the memory cell has a high resistance, the potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

In this manner, by using the reading circuit, data can be read from the memory cell. Note that the reading circuit of this embodiment is one example. Another circuit may be used. The reading circuit may further include a precharge circuit. Instead of the reference potential Vref, a reference bit line may be connected to the sense amplifier circuit.

Figure 9B:
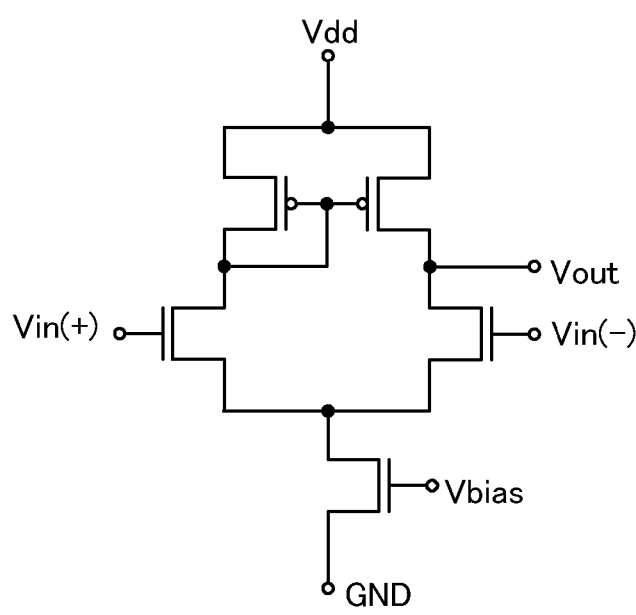

FIG. 9B illustrates a differential sense amplifier which is an example of sense amplifier circuits. The differential sense amplifier has input terminals Vin(+) and Vin(−) and an output terminal Vout, and amplifies a difference between a potential of Vin(+) and a potential of Vin(−). If the potential of Vin(+) is higher than the potential of Vin(−), the output from Vout is relatively high, whereas if the potential of Vin(+) is lower than the potential of Vin(−), the output from Vout is relatively low. In the case where the differential sense amplifier is used for the reading circuit, one of the input terminals Vin(+) and Vin(−) is connected to the terminal A, and the reference potential Vref is supplied to the other of the input terminals Vin(+) and Vin(−).

Figure 9C:
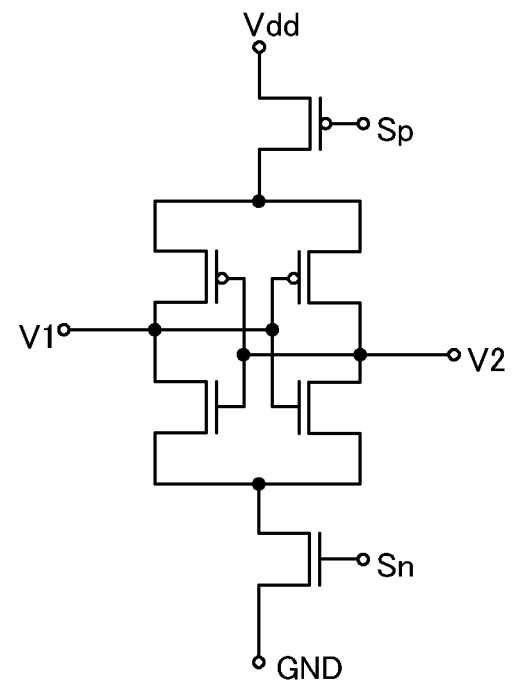

FIG. 9C illustrates a latch sense amplifier which is an example of sense amplifier circuits. The latch sense amplifier has input/output terminals V1 and V2 and input terminals for control signals Sp and Sn. First, the signal Sp is set high and the signal Sn is set low, and a power supply potential (Vdd) is interrupted. Then, potentials to be compared are supplied to V1 and V2. After that, the signal Sp is set low and the signal Sn is set high, and the power supply potential (Vdd) is supplied. If the potentials V1in and V2in to be compared satisfy V1in>V2in, the output from V1 is high and the output from V2 is low, whereas if the potentials satisfy V1in<V2in, the output from V1 is low and the output from V2 is high. By utilizing such a relationship, the difference between V1in and V2in can be amplified. In the case where the latch sense amplifier is used for the reading circuit, one of V1 and V2 is connected to the terminal A and an output terminal through a switch, and the reference potential Vref is supplied to the other of V1 and V2.

With the use of any of the transistors described in the above embodiments as a writing transistor of a memory cell in the above-described semiconductor device which can be used as a memory device, the short-channel effect of the writing transistor can be suppressed, and miniaturization can be achieved. Accordingly, the semiconductor device which can be used as a memory device can have higher integration.

The structures, methods, and the like described in this embodiment can be combined as appropriate with any of the structures, methods, and the like described in the other embodiments.

Embodiment 5

In this embodiment, an example of application of a semiconductor device according to one embodiment of the disclosed invention will be described with reference to FIG. 10. Here, a central processing unit (CPU) is described.

Figure 10:
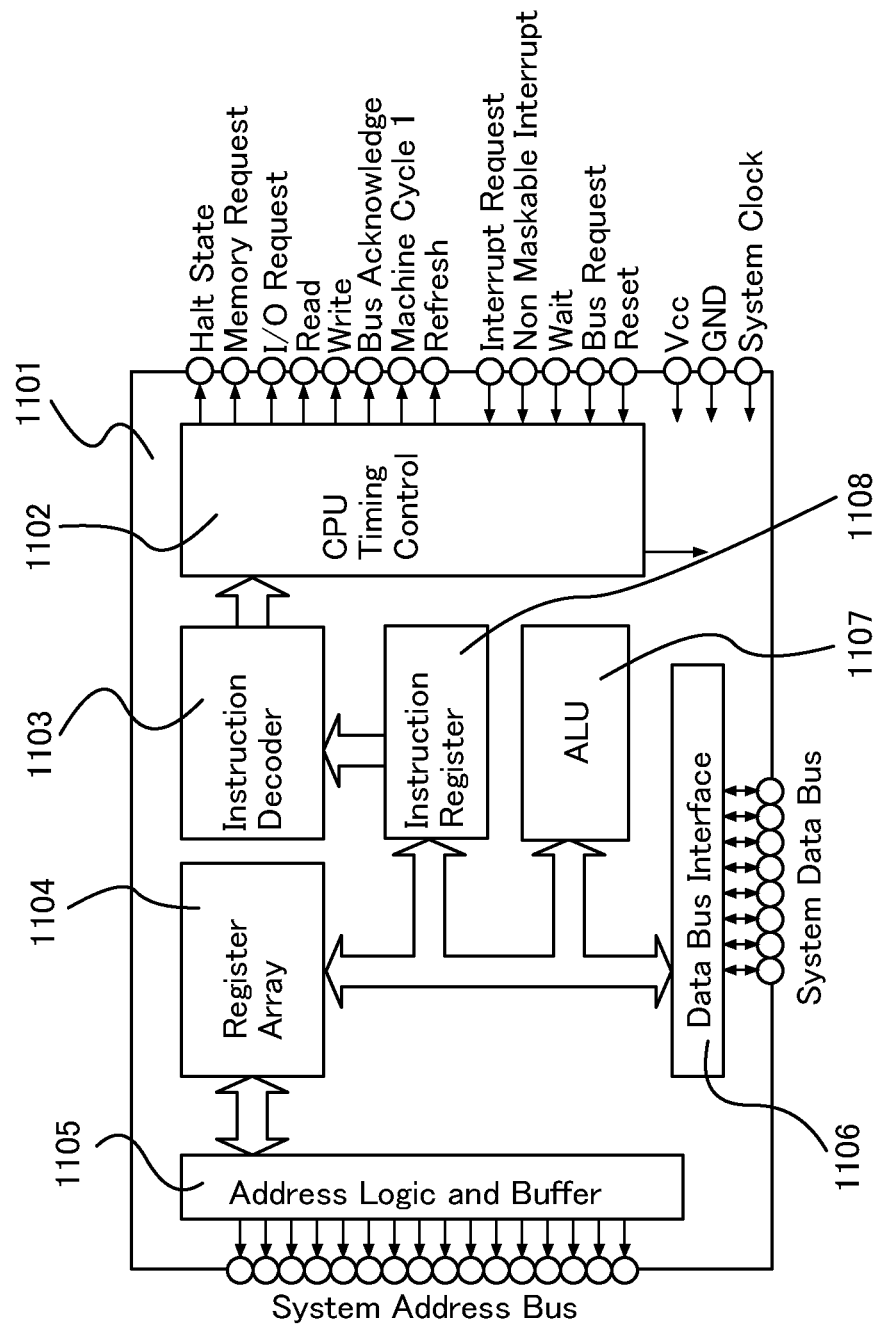
FIG. 10 is a diagram illustrating an example of application of a semiconductor device.

FIG. 10 illustrates an example of a block diagram of a CPU. A CPU 1101 illustrated in FIG. 10 includes a timing control circuit 1102, an instruction decoder 1103, a register array 1104, an address logic and buffer circuit 1105, a data bus interface 1106, an arithmetic logic unit (ALU) 1107, an instruction register 1108, and the like.

These circuits are manufactured using any of the transistors described in the above embodiments, an inverter circuit, a resistor, a capacitor, and the like. Because the transistors described in the above embodiments can achieve an extremely small off-state current, a reduction in power consumption of the CPU 1101 can be realized. Furthermore, with the use of any of the transistors described in the above embodiments, the short-channel effect of the transistor can be suppressed, and miniaturization can be achieved.

Circuits included in the CPU 1101 will be briefly described below. The timing control circuit 1102 receives instructions from the outside, converts the instructions into information for the inside, and transmits the information to another block. In addition, the timing control circuit 1102 gives directions such as reading and writing of memory data to the outside, according to internal operation. The instruction decoder 1103 functions to convert instructions from the outside into instructions for the inside. The register array 1104 functions to temporarily store data. The address logic and buffer circuit 1105 functions to specify the address of an external memory. The data bus interface 1106 functions to take data in and out of an external memory or a device such as a printer. The ALU 1107 functions to perform an operation. The instruction register 1108 functions to temporarily store instructions. The CPU includes such a combination of circuits.

With the use of any of the transistors described in the above embodiments in at least part of the CPU 1101, the short-channel effect of the transistor can be suppressed, and miniaturization can be achieved. Thus, the CPU 1101 can have higher integration.

The structures, methods, and the like described in this embodiment can be combined as appropriate with any of the structures, methods, and the like described in the other embodiments.

Embodiment 6

In this embodiment, an example of application of a semiconductor device according to one embodiment of the disclosed invention will be described with reference to FIGS. 11A and 11B. Here, an example of a semiconductor device having an image sensor function for reading information of an object will be described. Note that in some circuit diagrams, "OS" is written beside a transistor in order to indicate that the transistor includes an oxide semiconductor.

Figure 11A:
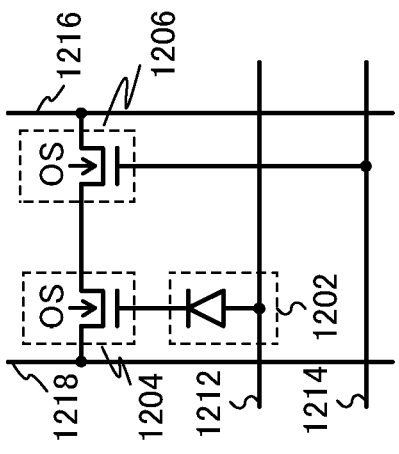
FIGS. 11A and 11B are diagrams illustrating an example of application of a semiconductor device.

FIG. 11A illustrates an example of a semiconductor device having an image sensor function. FIG. 11A is an equivalent circuit diagram of a photosensor, and FIG. 11B is a cross-sectional view of part of the photosensor.

One electrode of a photodiode 1202 is electrically connected to a photodiode reset signal line 1212, and the other electrode of the photodiode 1202 is electrically connected to a gate electrode of a transistor 1204. One of a source electrode and a drain electrode of the transistor 1204 is electrically connected to a photosensor reference signal line 1218, and the other of the source electrode and the drain electrode of the transistor 1204 is electrically connected to one of a source electrode and a drain electrode of a transistor 1206. A gate electrode of the transistor 1206 is electrically connected to a gate signal line 1214, and the other of the source electrode and the drain electrode of the transistor 1206 is electrically connected to a photosensor output signal line 1216.

Here, transistors including an oxide semiconductor are used as the transistor 1204 and the transistor 1206 illustrated in FIG. 11A. Here, any of the transistors described in the above embodiments can be used as the transistors including an oxide semiconductor. Because the transistors described in the above embodiments can achieve an extremely small leakage current in an off state, the photodetection accuracy of the photosensor can be improved. Furthermore, with the use of any of the transistors described in the above embodiments, the short-channel effect of the transistor can be suppressed, and miniaturization can be achieved. Thus, the area of the photodiode can be increased, and the photodetection accuracy of the photosensor can be improved.

Figure 11B:
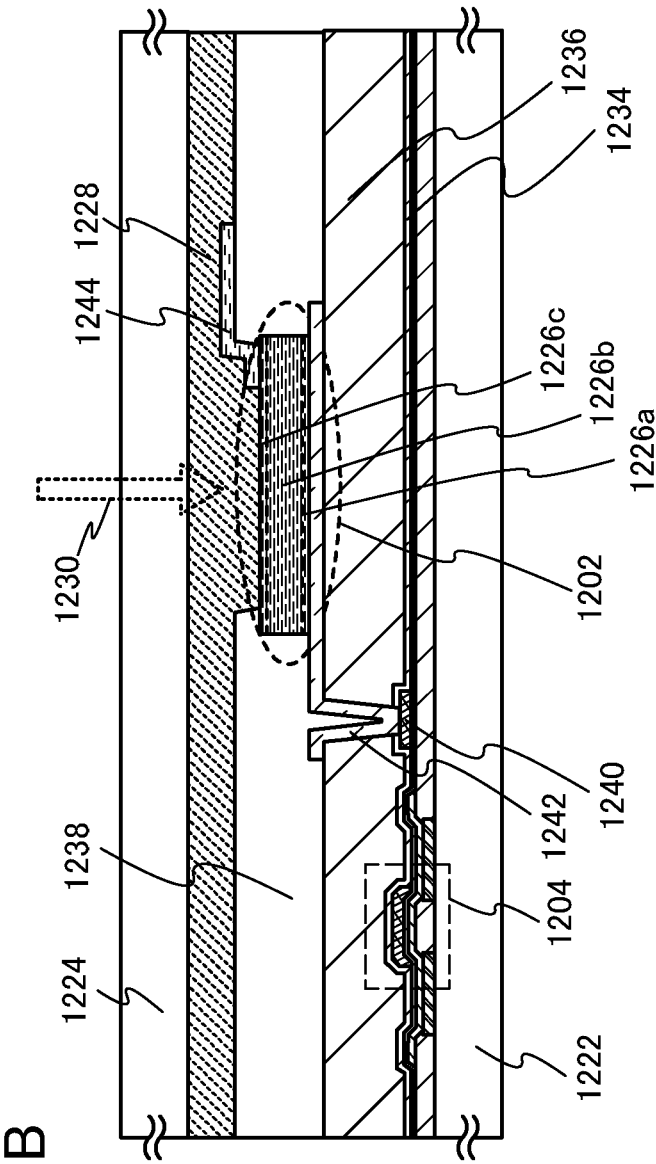

FIG. 11B is a cross-sectional view illustrating the photodiode 1202 and the transistor 1204 in the photosensor. The photodiode 1202 functioning as a sensor and the transistor 1204 are provided over a substrate 1222 having an insulating surface (a TFT substrate). A substrate 1224 is provided over the photodiode 1202 and the transistor 1204 using an adhesive layer 1228. An insulating layer 1234, an interlayer insulating layer 1236, and an interlayer insulating layer 1238 are provided over the transistor 1204.

A gate electrode layer 1240 is provided in the same layer as the gate electrode of the transistor 1204 so as to be electrically connected to the gate electrode. The gate electrode layer 1240 is electrically connected to an electrode layer 1242 provided over the interlayer insulating layer 1236, through an opening formed in the insulating layer 1234 and the interlayer insulating layer 1236. Because the photodiode 1202 is formed over the electrode layer 1242, the photodiode 1202 and the transistor 1204 are electrically connected to each other through the gate electrode layer 1240 and the electrode layer 1242.

The photodiode 1202 has a structure in which a first semiconductor layer 1226a, a second semiconductor layer 1226b, and a third semiconductor layer 1226c are stacked in this order over the electrode layer 1242. In other words, the first semiconductor layer 1226a of the photodiode 1202 is electrically connected to the electrode layer 1242. The third semiconductor layer 1226c of the photodiode 1202 is electrically connected to an electrode layer 1244 provided over the interlayer insulating layer 1238.

Here, a PIN photodiode is given as an example, in which a semiconductor layer having n-type conductivity as the first semiconductor layer 1226a, a high-resistance semiconductor layer (an i-type semiconductor layer) as the second semiconductor layer 1226b, and a semiconductor layer having p-type conductivity as the third semiconductor layer 1226c are stacked.

The first semiconductor layer 1226a is an n-type semiconductor layer and is formed with an amorphous silicon film containing an impurity element imparting n-type conductivity. The first semiconductor layer 1226a is formed by a plasma CVD method with the use of a semiconductor source gas containing an impurity element belonging to Group 15 (such as phosphorus (P)). As the semiconductor source gas, silane ($SiH_4$) may be used. Alternatively, disilane ($Si_2H_6$), dichlorosilane ($SiH_2Cl_2$), trichlorosilane ($SiHCl_3$), silicon tetrachloride ($SiCl_4$), silicon tetrafluoride ($SiF_4$), or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be conducted in order to diffuse the impurity element. In this case, as a method for forming the amorphous silicon film, an LPCVD method, a vapor deposition method, a sputtering method, or the like may be used. The first semiconductor layer 1226a is preferably formed so as to have a thickness of 20 nm to 200 nm.

The second semiconductor layer 1226b is an i-type semiconductor layer (an intrinsic semiconductor layer) and is formed with an amorphous silicon film. As the second semiconductor layer 1226b, an amorphous silicon film is formed by a plasma CVD method with use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 1226b may alternatively be formed by an LPCVD method, a vapor deposition method, a sputtering method, or the like. The second semiconductor layer 1226b is preferably formed so as to have a thickness of 200 nm to 1000 nm.

The third semiconductor layer 1226c is a p-type semiconductor layer and is formed with an amorphous silicon film containing an impurity element imparting p-type conductivity. The third semiconductor layer 1226c is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be performed in order to diffuse the impurity element. In this case, as a method for forming the amorphous silicon film, an LPCVD method, a vapor deposition method, a sputtering method, or the like may be used. The third semiconductor layer 1226c is preferably formed so as to have a thickness of 10 nm to 50 nm.

The first semiconductor layer 1226a, the second semiconductor layer 1226b, and the third semiconductor layer 1226c are not necessarily formed using an amorphous semiconductor, and they may be formed using a polycrystalline semiconductor or a microcrystalline semiconductor (or a semi-amorphous semiconductor (SAS)).

The microcrystalline semiconductor belongs to a metastable state which is an intermediate state between an amorphous state and a single crystal state according to Gibbs free energy. That is, the microcrystalline semiconductor is a semiconductor having a third state which is thermodynamically stable and has a short range order and lattice distortion. In the microcrystalline semiconductor, columnar or needle-like crystals grow in a normal direction with respect to a surface of a substrate. The Raman spectrum of microcrystalline silicon, which is a typical example of the microcrystalline semiconductor, is shifted to a smaller wavenumber region than 520 $cm^{-1}$ which represents single crystal silicon. That is, the peak of the Raman spectrum of microcrystalline silicon exists between 520 $cm^{-1}$ which represents single crystal silicon and 480 $cm^{-1}$ which represents amorphous silicon. The microcrystalline semiconductor includes at least 1 at. % of hydrogen or halogen to terminate a dangling bond. Moreover, a rare gas element such as helium, argon, krypton, or neon may be included to further promote lattice distortion, so that a favorable microcrystalline semiconductor film with enhanced stability can be obtained.

This microcrystalline semiconductor film can be formed by a high-frequency plasma CVD method with a frequency of several tens to several hundreds of megahertz or a microwave plasma CVD method with a frequency of 1 GHz or more. Typically, the microcrystalline semiconductor film can be formed by using a gas obtained by diluting a gas including silicon, such as $SiH_4$, $Si_2H_6$, $SiH_2Cl_2$, $SiHCl_3$, $SiCl_4$, or $SiF_4$, with hydrogen. Alternatively, the microcrystalline semiconductor film can be formed by using a gas including silicon which is diluted with hydrogen and one or more rare gas elements selected from helium, argon, krypton, and neon. In this case, the flow rate of hydrogen is set 5 times to 200 times, preferably 50 times to 150 times, more preferably 100 times, as high as that of a gas including silicon. Furthermore, a gas including silicon may be mixed with a hydrocarbon gas such as $CH_4$ or $C_2H_6$, a gas including germanium gas such as $GeH_4$ or $GeF_4$, $F_2$, or the like.

The mobility of holes generated by the photoelectric effect is lower than the mobility of electrons. Therefore, a PIN photodiode has better characteristics when a surface on the p-type semiconductor layer side is used as a light-receiving plane. Here, an example where the photodiode 1202 receives incident light 1230 from the substrate 1224 side and converts it into electric signals is described. Further, light from a side on which the semiconductor layer having a conductivity type opposite to that of the semiconductor layer on the light-receiving plane side is disturbance light; therefore, the electrode layer 1242 is preferably formed using a light-blocking conductive film. Note that the n-type semiconductor layer side may alternatively be a light-receiving plane.

When the incident light 1230 enters from the substrate 1224 side, the oxide semiconductor layer of the transistor 1204 can be shielded from the incident light 1230 by the gate electrode of the transistor 1204.

The insulating layer 1234, the interlayer insulating layer 1236, and the interlayer insulating layer 1238 can be formed using an insulating material by a method such as a sputtering method, an SOG method, a spin coating method, a dip-coating method, a spray coating method, a screen printing method, an offset printing method or a droplet discharge method (e.g., an inkjet method) depending on the material.

The insulating layer 1234 may be a single layer or stacked layers of an inorganic insulating material, with any of oxide insulating layers or nitride insulating layers such as a silicon oxide layer, a silicon oxynitride layer, a silicon nitride layer, a silicon nitride oxide layer, an aluminum oxide layer, an aluminum oxynitride layer, an aluminum nitride layer, or an aluminum nitride oxide layer. In addition, a high-quality insulating layer which is dense and has high withstand voltage can be formed by a high-density plasma CVD method using microwaves (2.45 GHz), which is preferable.

For a reduction of the surface roughness, an insulating layer functioning as a planarization insulating film is preferably used as the interlayer insulating layers 1236 and 1238. The interlayer insulating layers 1236 and 1238 can be formed using an organic insulating material having heat resistance such as a polyimide, an acrylic resin, benzocyclobutene-based resin, a polyamide, or an epoxy resin. Other than such organic insulating materials, it is possible to use a single layer or stacked layers of a low dielectric constant material (a low-k material), a siloxane-based resin, phosphosilicate glass (PSG), borophosphosilicate glass (BPSG), or the like.

The photodiode 1202 can read information of an object by detecting the incident light 1230. Note that a light source such as a backlight can be used at the time of reading information of an object.

In the photosensor described above, any of the transistors described in the above embodiments can be used as the transistor including an oxide semiconductor. Because the transistors described in the above embodiments can achieve an extremely small leakage current in an off state, the photodetection accuracy of the photosensor can be improved. Furthermore, with the use of any of the transistors described in the above embodiments, the short-channel effect of the transistor can be suppressed, and miniaturization can be achieved. Thus, the area of the photodiode can be increased, and the photodetection accuracy of the photosensor can be improved.

The structures, methods, and the like described in this embodiment can be combined as appropriate with any of the structures, methods, and the like described in the other embodiments.

Embodiment 7

In this embodiment, the cases where any of the semiconductor devices described in the above embodiments is applied to electronic devices will be described with reference to FIGS. 12A to 12F. The cases where any of the above-described semiconductor devices is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 12A:
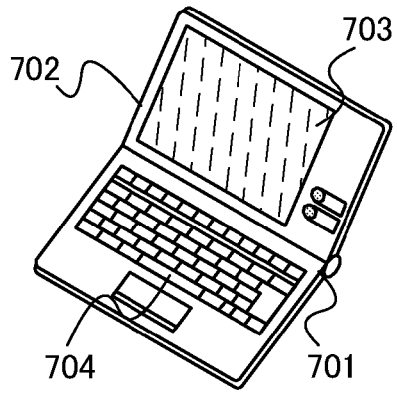
FIGS. 12A to 12F are diagrams each illustrating an electronic device including a semiconductor device.

FIG. 12A illustrates a notebook personal computer, which includes a housing 701, a housing 702, a display portion 703, a keyboard 704, and the like. At least one of the housings 701 and 702 is provided with any of the semiconductor devices described in the above embodiments. Therefore, a notebook personal computer which operates at high speed and consumes less power, for example, can be realized.

Figure 12B:
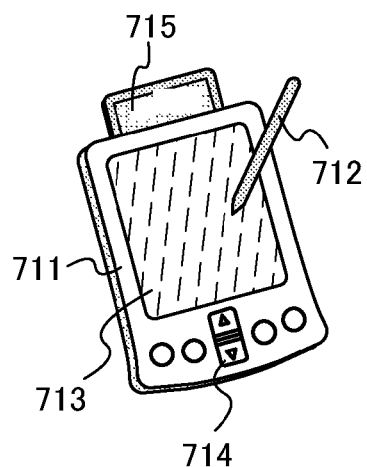

FIG. 12B illustrates a portable information terminal (PDA). A main body 711 is provided with a display portion 713, an external interface 715, operation buttons 714, and the like. Further, a stylus 712 for operation of the portable information terminal, or the like is provided. The main body 711 is provided with any of the semiconductor devices described in the above embodiments. Therefore, a portable information terminal which operates at high speed and consumes less power, for example, can be realized.

Figure 12C:
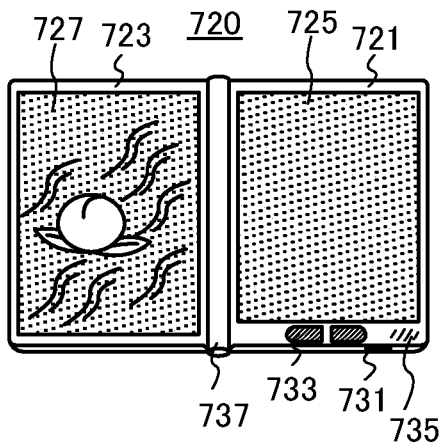

FIG. 12C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book 720 can be opened and closed using the hinge 737 as an axis. In addition, the housing 721 is provided with a power switch 731, operation keys 733, a speaker 735, and the like. At least one of the housings 721 and 723 is provided with any of the semiconductor devices described in the above embodiments. Therefore, an electronic book which operates at high speed and consumes less power, for example, can be realized.

Figure 12D:
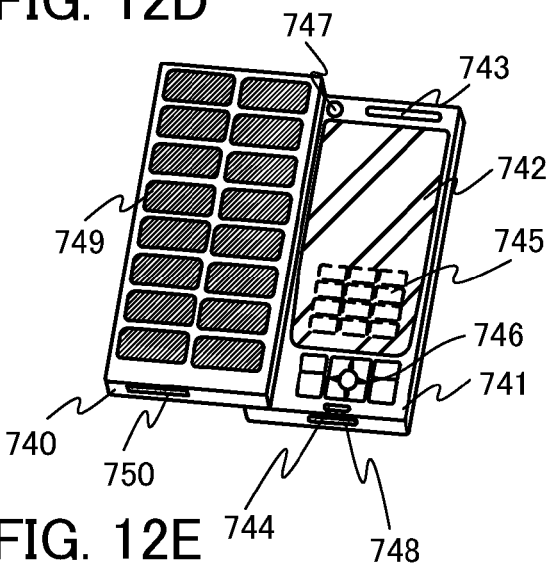

FIG. 12D illustrates a mobile phone set, which includes two housings, a housing 740 and a housing 741. The housings 740 and 741 in a state where they are developed as illustrated in FIG. 12D can be slid so that one is lapped over the other. Therefore, the size of the mobile phone set can be reduced, which makes the mobile phone set suitable for being carried around. The housing 741 includes a display panel 742, a speaker 743, a microphone 744, a touch panel 745, a pointing device 746, a camera lens 747, an external connection terminal 748, and the like. The housing 740 includes a solar cell 749 for charging the mobile phone set, an external memory slot 750, and the like. An antenna is incorporated in the housing 741. At least one of the housings 740 and 741 is provided with any of the semiconductor devices described in the above embodiments. Therefore, a mobile phone set which operates at high speed and consumes less power, for example, can be realized.

Figure 12E:
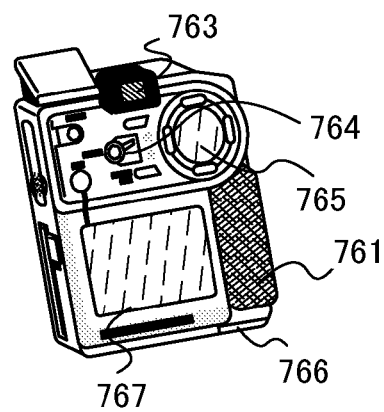

FIG. 12E illustrates a digital camera, which includes a main body 761, a display portion 767, an eyepiece 763, an operation switch 764, a display portion 765, a battery 766, and the like. The main body 761 is provided with any of the semiconductor devices described in the above embodiments. Therefore, a digital camera which operates at high speed and consumes less power, for example, can be realized.

Figure 12F:
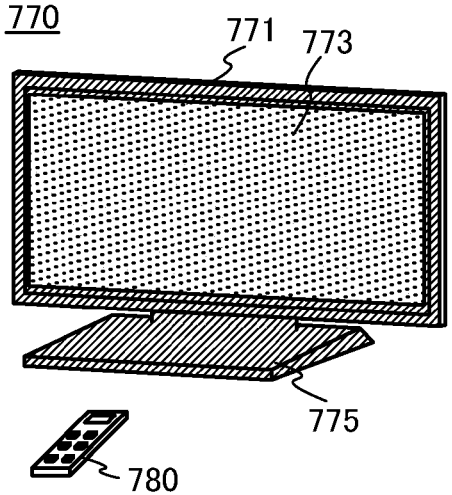

FIG. 12F is a television set 770, which includes a housing 771, a display portion 773, a stand 775, and the like. The television set 770 can be operated with a switch included in the housing 771 or with a remote controller 780. The housing 771 and the remote controller 780 are provided with any of the semiconductor devices described in the above embodiments. Therefore, a television set which operates at high speed and consumes less power, for example, can be realized.

As described above, the electronic devices described in this embodiment each include any of the semiconductor devices according to the above embodiments. Therefore, an electronic device whose operation speed is increased and power consumption is reduced by miniaturization of the semiconductor device can be obtained.

Example 1

In this example, results of examination, by computational simulation, of the effect of the disclosed invention in terms of suppression of a short-channel effect will be described. Note that calculations (a first calculation and a second calculation) were carried out using a device simulator "Atlas" produced by Silvaco Data Systems Inc.

Figure 13A:
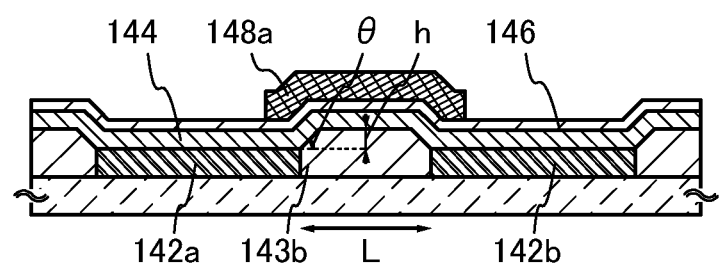
FIGS. 13A and 13B are diagrams each illustrating a model used for calculation.
Figure 13B:
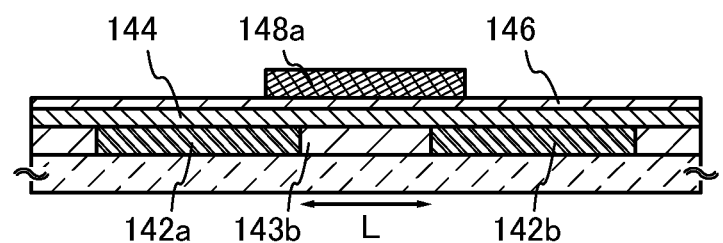

The first calculation was carried out using models illustrated in FIGS. 13A and 13B. FIG. 13A illustrates a transistor having a structure in which there is a small difference in height between an upper surface of an insulating layer and an upper surface of a source electrode and a drain electrode (hereinafter, Structure A), according to one embodiment of the disclosed invention. FIG. 13B illustrates a transistor having a structure in which there is no such difference in height (hereinafter, Structure B), as a comparative example. Note that a structure in which an insulating layer 143*b* does not cover a source electrode 142*a* and a drain electrode 142*b* as illustrated in FIG. 13A is employed as Structure A for simplicity of the calculation; there is not much computational difference between the structure and a structure in which the insulating layer 143*b* covers the source electrode 142*a* and the drain electrode 142*b*.

In the calculation, the inclination angle θ of a side surface of a region where the difference in height is made (hereinafter referred to as a projecting region) and the height h of the projecting region were variables. Note that components denoted by reference numerals in FIGS. 13A and 13B correspond to the components denoted by the same reference numerals and described in the above embodiment. In addition, the calculation models of this example do not include some components such as the insulating layer 150, but this does not affect the result of calculation.

Other parameters used for the calculation are as follows.
Thickness of oxide semiconductor layer: 10 nm
Material of oxide semiconductor layer: In—Ga—Zn—O-based metal oxide (band gap Eg: 3.15 eV, electron affinity (χ): 4.3 eV, relative permittivity: 15, electron mobility: 10 cm$^2$/Vs)
Thickness of gate insulating layer: 10 nm
Material of gate insulating layer: hafnium oxide (relative permittivity: 15)
Material of source and drain electrodes: titanium nitride (work function: 3.9 eV)
Material of gate electrode: tungsten (work function: 4.9 eV)

Figure 14:
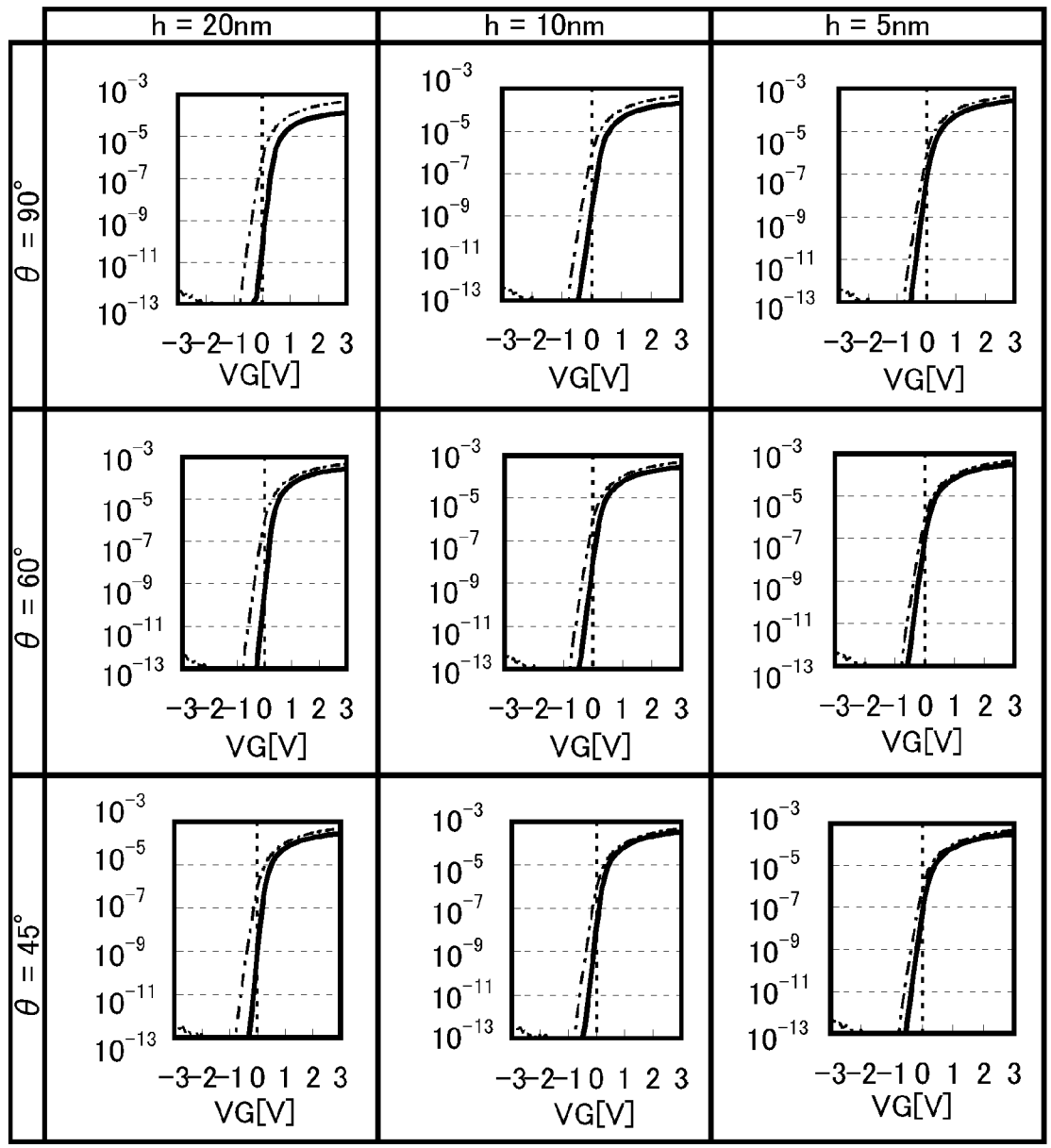
FIG. 14 is a diagram showing the relationship between gate voltage VG (V) and drain current ID (A).
Figure 15:
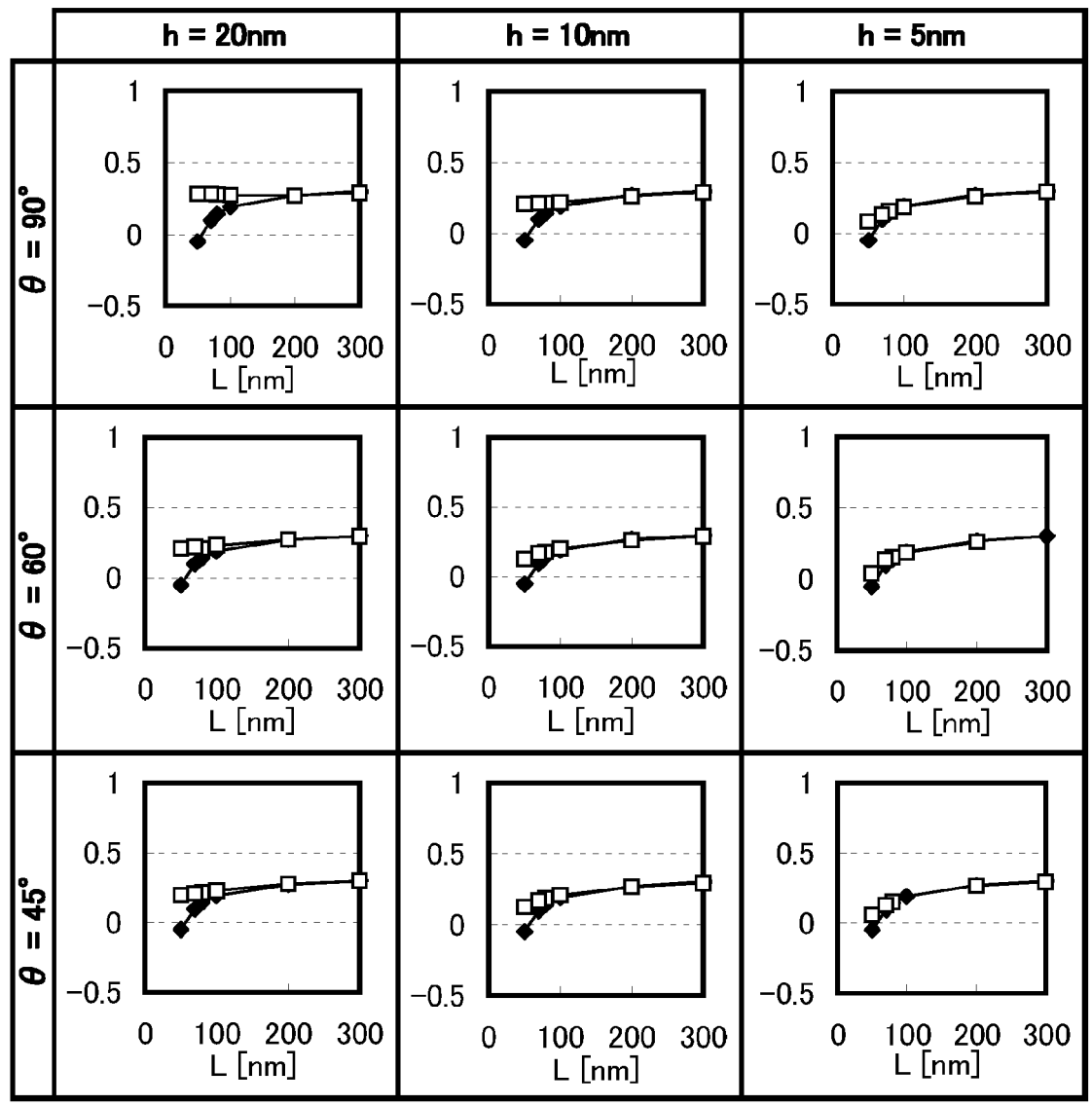
FIG. 15 is a diagram showing the relationship between channel length L (nm) and threshold voltage Vth (V).
Figure 16:
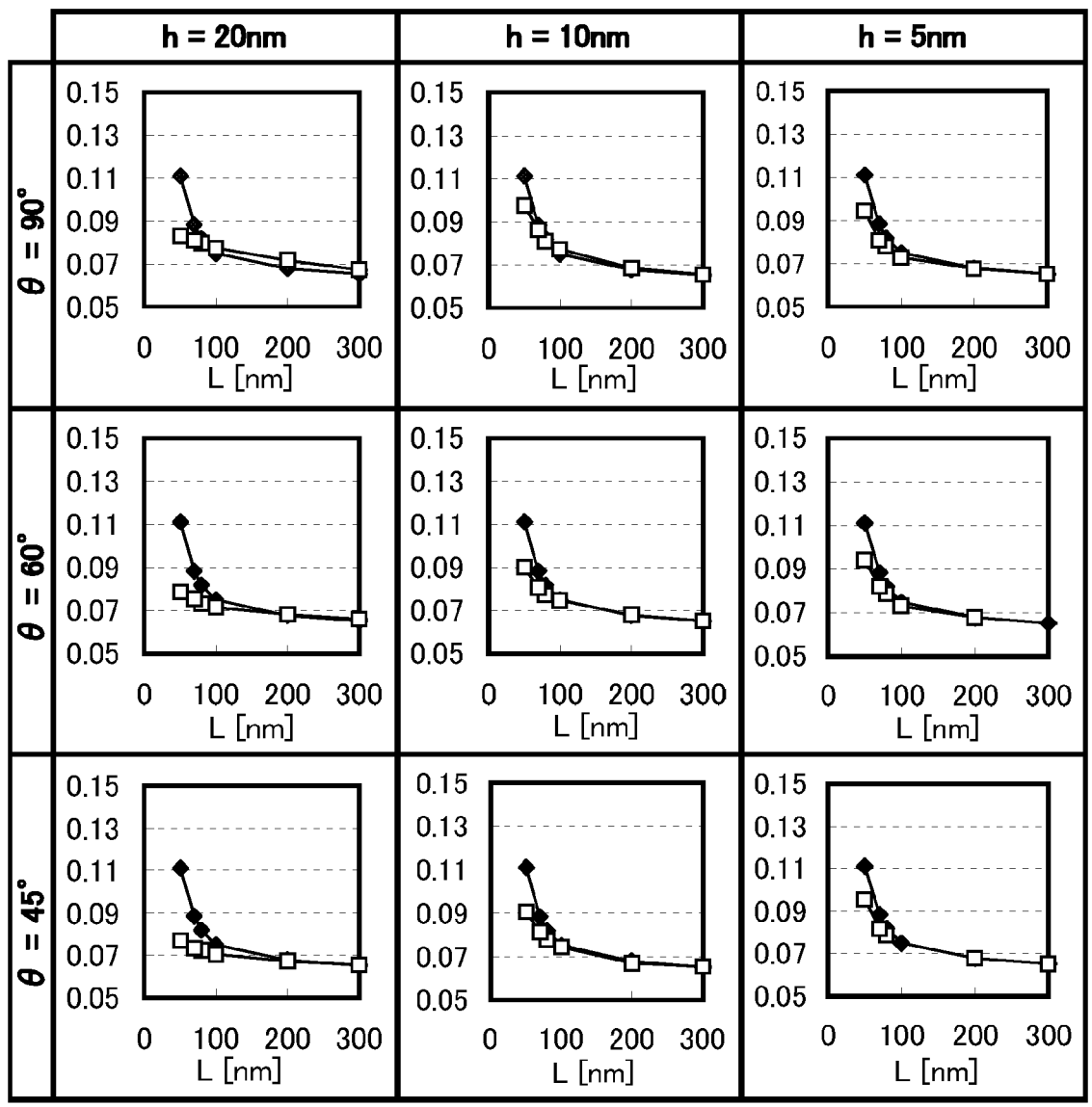
FIG. 16 is a diagram showing the relationship between channel length L (nm) and S value (V/dec).

The results of the first calculation are shown in FIG. 14, FIG. 15, and FIG. 16. FIG. 14 shows the relationship between gate voltage VG (V) and drain current ID (A); FIG. 15, the relationship between channel length L (nm) and threshold voltage Vth (V); and FIG. 16, the relationship between channel length L (nm) and S value (V/dec). Note that each of FIG. 14, FIG. 15, and FIG. 16 shows results obtained with different inclination angles θ of 45°, 60°, and 90° and heights h of 5 nm, 10 nm, and 20 nm.

The results in FIG. 14, FIG. 15, and FIG. 16 show that there is no significant difference between Structure A and Structure B when the channel length L is more than 100 nm, whereas a negative shift in threshold voltage Vth and an increase in S value are suppressed in Structure A when the channel length L is 100 nm or less. That is, a short-channel effect can be suppressed in Structure A, in comparison with Structure B.

Figure 17A:
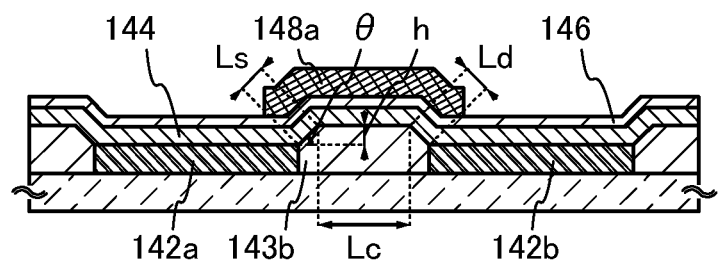
FIGS. 17A and 17B are diagrams each illustrating a model used for calculation.
Figure 17B:
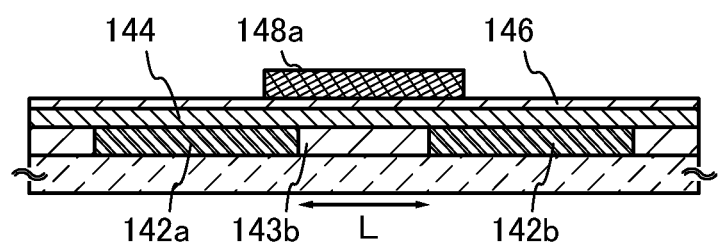

The second calculation was carried out using models illustrated in FIGS. 17A and 17B. FIG. 17A illustrates Structure A, and FIG. 17B illustrates Structure B. A difference between the first and second calculations is that the distance between the source electrode and the drain electrode is defined as the channel length L in the first calculation, whereas the channel length L in the second calculation is measured along the projecting shape of the insulating layer. In other words, in FIG. 17A, the channel length L equals Ls+Lc+Ld. By defining the channel length L in FIG. 17A in this manner, the effect of an increase in effective value of the channel length L can be counteracted, and an effect resulting from the shape can be accurately observed.

Figure 18:
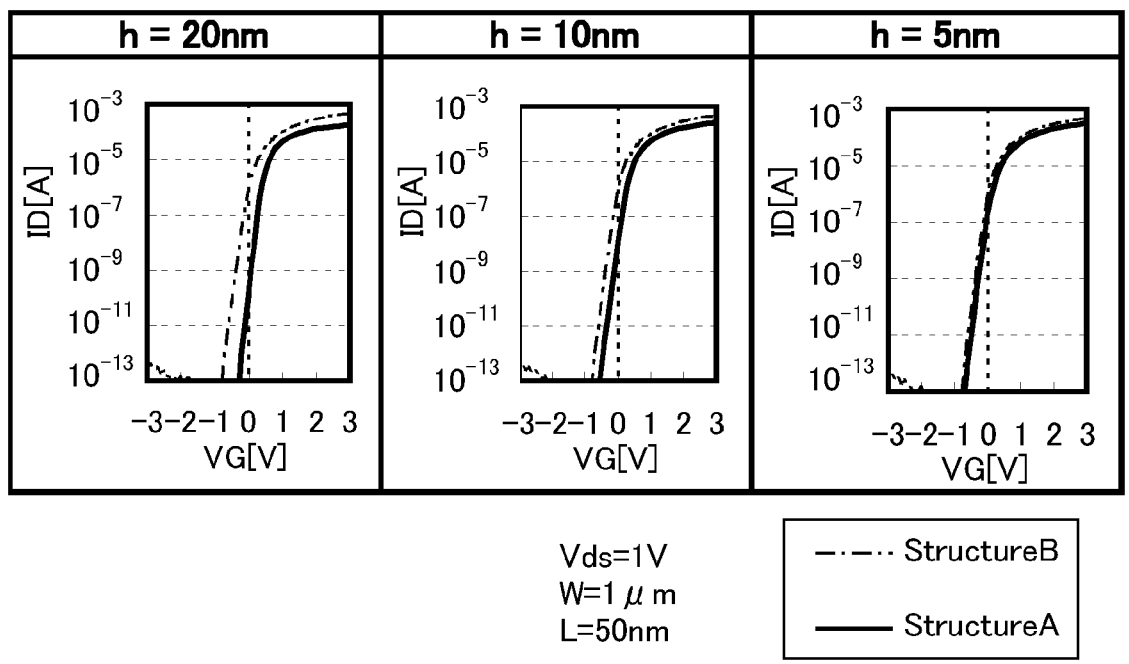
FIG. 18 is a diagram showing the relationship between gate voltage VG (V) and drain current ID (A).

FIG. 18 shows the relationship between gate voltage VG (V) and drain current ID (A) which is obtained from the results of the second calculation. Here, the inclination angle θ is fixed to 90°, and the height h is set to 5 nm, 10 nm, and 20 nm. FIG. 18 shows that a negative shift in threshold voltage Vth is suppressed in the structure in which there is a small difference in height between the upper surface of the insulating layer and the upper surface of the source and drain electrode (Structure A), owing to its shape. In other words, it can be understood that the shape suppresses a short-channel effect.

Note that it can be seen from the results of the first and second calculations that a short-channel effect is less easily caused as the height h increases. However, if there is a large difference in height, a decrease in coverage may cause a disconnection of the oxide semiconductor layer or the like. Thus, the difference in height is set to 30 nm or less, preferably 20 nm or less.

This application is based on Japanese Patent Application serial no. 2010-051008 filed with Japan Patent Office on Mar. 8, 2010, the entire contents of which are hereby incorporated by reference.

The invention claimed is:

1. A processor comprising:
a register array;
an arithmetic logic unit operationally connected to the register array; and
an instruction register operationally connected to the arithmetic logic unit,
wherein at least one of the register array, the arithmetic logic unit and the instruction register comprises a first transistor and a second transistor over the first transistor,
wherein a channel formation region of the first transistor comprises silicon,
wherein a channel formation region of the second transistor comprises an oxide semiconductor, and
wherein a gate electrode of the first transistor is electrically connected to one of a source electrode and a drain electrode of the second transistor.

2. The processor according to claim 1,
wherein the source electrode and the drain electrode of the second transistor are embedded in an insulating layer, and
wherein a difference in height exists between an upper surface of the insulating layer and upper surfaces of the source electrode and the drain electrode of the second transistor.

3. The processor according to claim 2,
wherein the upper surface of the insulating layer is in contact with the channel formation region of the second transistor, and
wherein the upper surface of the insulating layer has a root-mean-square roughness of 1 nm or less.

4. The processor according to claim 2,
wherein the difference in height between the upper surface of the insulating layer and the upper surfaces of the source electrode and the drain electrode of the second transistor is 5 nm or more.

5. The processor according to claim 2,
wherein the difference in height between the upper surface of the insulating layer and the upper surfaces of the source electrode and the drain electrode of the second transistor is 20 nm or less.

6. The processor according to claim 2,
wherein the upper surfaces of the source electrode and the drain electrode of the second transistor are partly covered with the insulating layer.

7. The processor according to claim 1,
wherein the processor is a CPU.

8. The processor according to claim 1, further comprising:
a silicon substrate, wherein the channel formation region of the first transistor is formed in the silicon substrate; and
an insulating layer over the first transistor, wherein the second transistor is formed over the insulating layer.

9. The processor according to claim 1, further comprising:
an insulating substrate, wherein the first transistor comprises a semiconductor layer comprising the channel formation region, and wherein the semiconductor layer is formed over the insulating substrate; and
an insulating layer over the first transistor, wherein the second transistor is formed over the insulating layer.

10. A processor comprising:
a register array;
an arithmetic logic unit operationally connected to the register array; and
an instruction register operationally connected to the arithmetic logic unit,
wherein at least one of the register array, the arithmetic logic unit and the instruction register comprises a first transistor and a second transistor over the first transistor,
wherein a channel formation region of the first transistor comprises silicon,
wherein a channel formation region of the second transistor comprises an oxide semiconductor,
wherein a gate electrode of the first transistor is electrically connected to one of a source electrode and a drain electrode of the second transistor, and
wherein a gate electrode of the second transistor is formed over the channel formation region of the second transistor.

11. The processor according to claim 10,
wherein the source electrode and the drain electrode of the second transistor are embedded in an insulating layer, and
wherein a difference in height exists between an upper surface of the insulating layer and upper surfaces of the source electrode and the drain electrode of the second transistor.

12. The processor according to claim 11,
wherein the upper surface of the insulating layer is in contact with the channel formation region of the second transistor, and
wherein the upper surface of the insulating layer has a root-mean-square roughness of 1 nm or less.

13. The processor according to claim 11,
wherein the difference in height between the upper surface of the insulating layer and the upper surfaces of the source electrode and the drain electrode of the second transistor is 5 nm or more.

14. The processor according to claim 11,
wherein the difference in height between the upper surface of the insulating layer and the upper surfaces of the source electrode and the drain electrode of the second transistor is 20 nm or less.

15. The processor according to claim 11,
wherein the upper surfaces of the source electrode and the drain electrode of the second transistor are partly covered with the insulating layer.

16. The processor according to claim 10,
wherein the processor is a CPU.

17. The processor according to claim 10, further comprising:
a silicon substrate, wherein the channel formation region of the first transistor is formed in the silicon substrate; and
an insulating layer over the first transistor, wherein the second transistor is formed over the insulating layer.

18. The processor according to claim 10, further comprising:
an insulating substrate, wherein the first transistor comprises a semiconductor layer comprising the channel formation region, and wherein the semiconductor layer is formed over the insulating substrate; and
an insulating layer over the first transistor, wherein the second transistor is formed over the insulating layer.

* * * * *

UNITED STATES PATENT AND TRADEMARK OFFICE
CERTIFICATE OF CORRECTION

PATENT NO. : 8,664,653 B2  Page 1 of 1
APPLICATION NO. : 13/037545
DATED : March 4, 2014
INVENTOR(S) : Shunpei Yamazaki et al.

It is certified that error appears in the above-identified patent and that said Letters Patent is hereby corrected as shown below:

In the Specification

At column 3, line 43, " $S_0 = |X_2 - X_1| \cdot |Y_2 Y_1|$ " should be -- $S_0 = |X_2 - X_1| \cdot |Y_2 - Y_1|$ --;

At column 3, line 53, " $Z_0 = \frac{1}{S_0} \int_{Y_1}^{Y_2} \int_{X_1}^{Y_2} F(X, Y) dX dY$ " should be -- $Z_0 = \frac{1}{S_0} \int_{Y_1}^{Y_2} \int_{X_1}^{X_2} F(X, Y) dX dY$ --;

At column 27, line 36, "R1 ROS" should be --R1 ≥ ROS--;

At column 27, line 37, "R2 ROS" should be --R2 ≥ ROS--;

At column 39, line 3, "angles 0" should be --angles θ--.

Signed and Sealed this
Nineteenth Day of August, 2014

Michelle K. Lee
*Deputy Director of the United States Patent and Trademark Office*